United States Patent
Hsieh

(10) Patent No.: US 12,107,175 B2
(45) Date of Patent: Oct. 1, 2024

(54) OPTICAL SEMICONDUCTOR DEVICE WITH CASCADE VIAS

(71) Applicant: NANYA TECHNOLOGY CORPORATION, New Taipei (TW)

(72) Inventor: Ming-Hung Hsieh, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 388 days.

(21) Appl. No.: 17/572,813

(22) Filed: Jan. 11, 2022

(65) Prior Publication Data

US 2023/0223482 A1 Jul. 13, 2023

(51) Int. Cl.
| | |
|---|---|
| *H01L 23/495* | (2006.01) |
| *H01L 25/16* | (2023.01) |
| *H01L 31/0216* | (2014.01) |
| *H01L 31/0232* | (2014.01) |
| *H01L 31/102* | (2006.01) |
| *H10B 99/00* | (2023.01) |

(52) U.S. Cl.
CPC ...... *H01L 31/02165* (2013.01); *H01L 25/167* (2013.01); *H01L 31/02327* (2013.01); *H01L 31/102* (2013.01); *H10B 99/00* (2023.02)

(58) Field of Classification Search
CPC ............. H01L 31/02165; H01L 25/167; H01L 31/02327; H01L 31/102; H01L 27/14605; H01L 27/1469; H01L 27/14634; H01L 27/14636; H01L 31/02162; H01L 27/14612; H01L 27/14683; H10B 99/00; H10B 80/00

See application file for complete search history.

(56) References Cited

U.S. PATENT DOCUMENTS

| | | | | |
|---|---|---|---|---|
| 2019/0088704 A1* | 3/2019 | Jang | .................. | H01L 27/14685 |
| 2020/0135790 A1* | 4/2020 | Kim | .................. | H01L 27/14618 |
| 2020/0266221 A1* | 8/2020 | Uchida | ............. | H01L 27/14614 |
| 2021/0351172 A1 | 11/2021 | Pei et al. | | |
| 2023/0187464 A1* | 6/2023 | Fan | .................. | H01L 27/14612 |
| | | | | 257/686 |
| 2023/0187465 A1* | 6/2023 | Hsueh | ............... | H01L 27/14612 |
| | | | | 257/432 |

FOREIGN PATENT DOCUMENTS

TW     I741793 B     10/2021

OTHER PUBLICATIONS

Office Action mailed on May 16, 2023 related to Taiwanese Application No. 111113282.

* cited by examiner

*Primary Examiner* — Ismail A Muse
(74) *Attorney, Agent, or Firm* — Xuan Zhang

(57) ABSTRACT

An optical semiconductor device with cascade vias is disclosed. The semiconductor device a logic die having a core circuit area and a logic peripheral circuit area; a memory die positioned on the logic die and having a memory cell area and a memory peripheral area; a first inter-die via positioned in the memory peripheral area; a landing pad positioned on the first inter-die via; and a sensor die positioned on the memory die and including a sensor pixel area and a sensor peripheral area, a first intra-die via positioned in the sensor peripheral area. The first inter-die via and the first intra-die via are electrically coupled through the landing pad in a cascade manner.

11 Claims, 31 Drawing Sheets

OPTICAL SEMICONDUCTOR DEVICE WITH CASCADE VIAS

TECHNICAL FIELD

The present disclosure relates to an optical semiconductor device, and more particularly, to an optical semiconductor device with cascade vias.

DISCUSSION OF THE BACKGROUND

Optical semiconductor devices are used in a variety of electronic applications, such as personal computers, cellular telephones, digital cameras, and other electronic equipment. The dimensions of optical semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides an optical semiconductor device including a logic die including a core circuit area and a logic peripheral circuit area; a memory die positioned on the logic die and including a memory cell area and a memory peripheral area, and a first inter-die via positioned in the memory peripheral area and electrically connected to the logic peripheral circuit area; and a sensor die positioned on the memory die and including a sensor pixel area and a sensor peripheral area, a first intra-die via positioned in the sensor peripheral area and electrically coupled to the logic peripheral circuit area through the first inter-die via, and a second intra-die via positioned in the sensor peripheral area. A height of the first intra-die via is greater than a height of the second intra-die via.

Another aspect of the present disclosure provides an optical semiconductor device including a logic die including a front surface; a memory die including a front surface positioned on the front surface of the logic die, and a back surface opposite to the front surface of the memory die; and a sensor die including a front surface positioned on the back surface of the memory die, a back surface opposite to the front surface of the sensor die, a sensor unit located at the back surface of the sensor die, a color filter positioned on the back surface of the sensor die, and a micro-lens positioned on the color filter.

Another aspect of the present disclosure provides an optical semiconductor device including a logic die including a core circuit area and a logic peripheral circuit area; a memory die positioned on the logic die and including a memory cell area and a memory peripheral area; a first inter-die via positioned in the memory peripheral area; a landing pad positioned on the first inter-die via; and a sensor die positioned on the memory die and including a sensor pixel area and a sensor peripheral area, a first intra-die via positioned in the sensor peripheral area. The first inter-die via and the first intra-die via are electrically coupled through the landing pad in a cascade manner.

Due to the design of the optical semiconductor device of the present disclosure, by employing the first inter-die via, the first intra-die via, and the second intra-die via, the signal produced in the sensor die may be transferred to the functional circuits of the logic die to perform various processing which usually needs complicate circuits. That is, the sensor die can only reserve the essential elements for optical sensing function so that the complexity of fabrication of the sensor die may be simplified. As a result, the yield of the optical semiconductor device may be improved. In addition, the first inter-die via, the first intra-die via, and the second intra-die via may also shorten the signal path between the function circuits of different dies so that the energy consumption for signal transferring may be reduced. Furthermore, by further integrating the memory die, the intermediate processing or the post processing signal may be easily stored.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
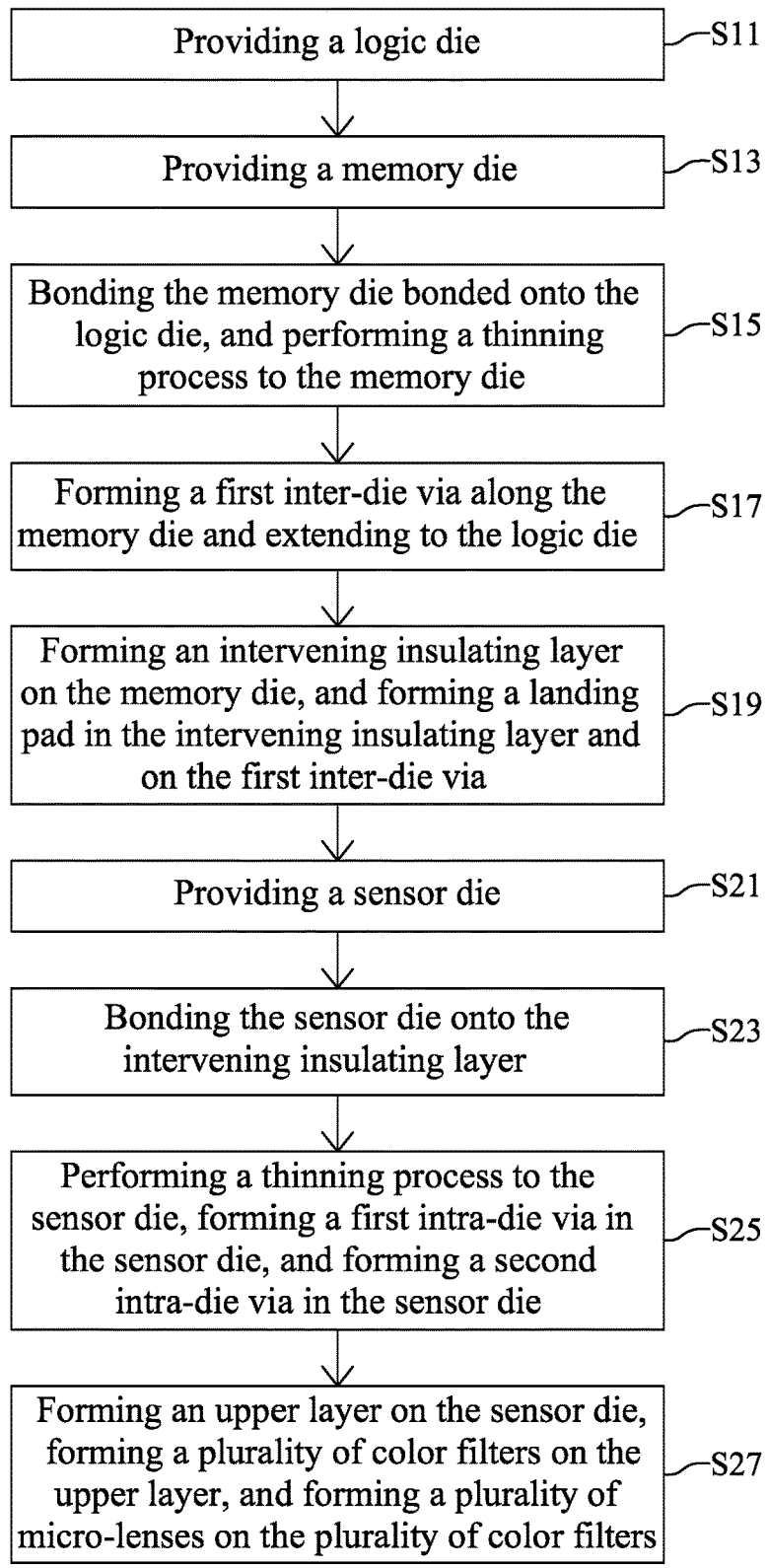
FIG. 1 illustrates, in a flowchart diagram form, a method for fabricating an optical semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, an optical semiconductor device generally means a device which can function by utilizing semiconductor characteristics, and an electro-optic device, a light-emitting display device, a semiconductor circuit, and an electronic device are all included in the category of the optical semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a flowchart diagram form, a method 10 for fabricating an optical semiconductor device 1A in accordance with one embodiment of the present disclosure. FIGS. 2 to 6 are schematic cross-sectional view diagrams illustrating part of a flow for fabricating the optical semiconductor device 1A in accordance with one embodiment of the present disclosure. FIG. 7 illustrates, in a schematic close-up cross-sectional view diagram, a first inter-die via 401 of the optical semiconductor device 1A in accordance with one embodiment of the present disclosure. FIGS. 8 to 15 are schematic cross-sectional view diagrams illustrating part of the flow for fabricating the optical semiconductor device 1A in accordance with one embodiment of the present disclosure.

Figure 2:
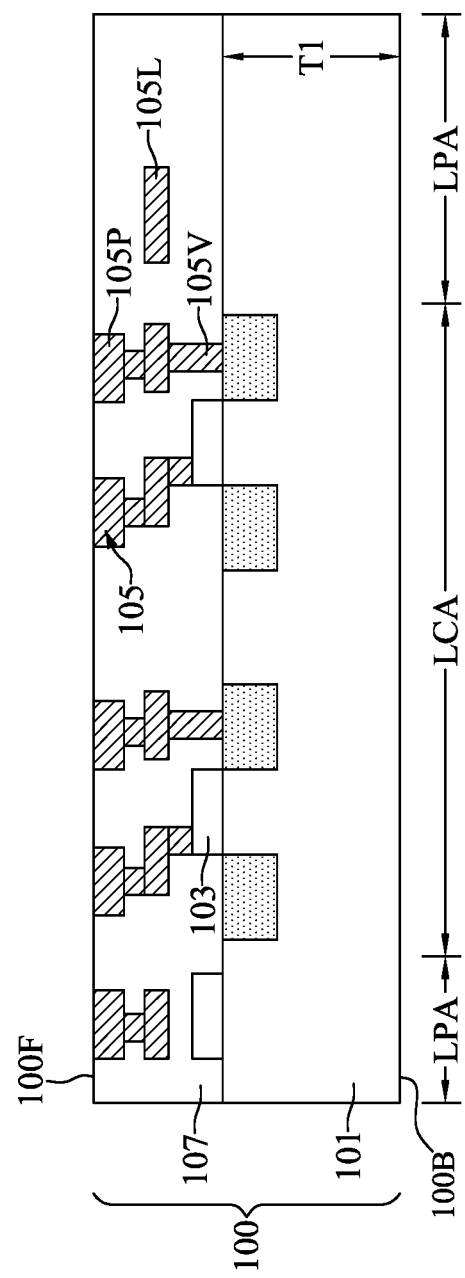
FIGS. 2 to 6 are schematic cross-sectional view diagrams illustrating part of a flow for fabricating the optical semiconductor device in accordance with one embodiment of the present disclosure.

With reference to FIGS. 1 and 2, at step S11, a logic die 100 may be provided.

With reference to FIG. 2, the logic die 100 may include a first substrate 101, a plurality of logic device elements 103, a plurality first conductive features 105, and a first dielectric layer 107.

With reference to FIG. 2, the first substrate 101 may be a bulk semiconductor substrate. The bulk semiconductor substrate may be formed of, for example, an elementary semiconductor such as silicon or germanium, or a compound semiconductor such as silicon germanium, silicon carbide, gallium arsenide, gallium phosphide, indium phosphide, indium arsenide, indium antimonide, or other III-V compound semiconductor or II-VI compound semiconductor.

In some embodiments, the thickness T1 of the first substrate 101 may be between about 500 μm and about 700 μm. For example, the thickness T1 of the first substrate 101 may be about 600 μm.

With reference to FIG. 2, the first substrate 101 may include a core circuit area LCA and a logic peripheral circuit area LPA. In some embodiments, the logic peripheral circuit area LPA may be next to the core circuit area LCA. In some embodiments, in a top-view perspective (not shown), the core circuit area LCA may be the central region of the first substrate 101. The logic peripheral circuit area LPA may be the peripheral region of the first substrate 101 which is surrounding the central region.

It should be noted that, in the description of the present disclosure, the core circuit area LCA may comprise a portion of the first substrate 101 and spaces above and under the portion of the first substrate 101. Describing an element as being disposed on the core circuit area LCA means that the element is disposed on a top surface of the portion of the first substrate 101. Describing an element as being disposed in the core circuit area LCA means that the element is disposed in the portion of the first substrate 101; however, a top surface of the element may be even with the top surface of the portion of the first substrate 101. Describing an element as being disposed above the core circuit area LCA means that the element is disposed above the top surface of the portion of the first substrate 101. Describing an element as being disposed under the core circuit area LCA means that the element is disposed under the bottom surface of the portion of the first substrate 101; wherein the element contacts the bottom surface of the portion of the first substrate 101 or is distant from the bottom surface of the portion of the first substrate 101. Accordingly, the logic peripheral circuit area LPA may comprise another portion of the first substrate 101 and spaces above and under the other portion of the first substrate 101.

With reference to FIG. 2, the logic device elements 103 may be formed on the first substrate 101. Some portions of the logic device elements 103 may be formed in the first substrate 101. The logic device elements 103 may be transistors such as complementary metal-oxide-semiconductor transistors, metal-oxide-semiconductor field-effect transistors, fin field-effect-transistors, the like, or a combination thereof.

With reference to FIG. 2, the first dielectric layer 107 may be formed on the first substrate 101. In some embodiments, the first dielectric layer 107 may be a stacked layer structure. The first dielectric layer 107 may include a plurality of insulating sub-layers. Each of the insulating sub-layers may have a thickness between about 0.5 µm and about 3.0 µm. The insulating sub-layers may be formed of, for example, silicon oxide, borophosphosilicate glass, undoped silicate glass, fluorinated silicate glass, low-k dielectric materials, the like, or a combination thereof. The insulating sub-layers may be formed of different materials but are not limited thereto.

The low-k dielectric materials may have a dielectric constant less than 3.0 or even less than 2.5. In some embodiments, the low-k dielectric materials may have a dielectric constant less than 2.0. The insulating sub-layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

It should be noted that, in the description of present disclosure, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIG. 2, the plurality first conductive features 105 may be formed in the first dielectric layer 107. The first conductive features 105 may include first conductive lines 105L, first conductive vias 105V, and first conductive pads 105P. The first conductive lines 105L may be separated from each other and may be horizontally disposed in the first dielectric layer 107 along the direction Z. In the present embodiment, the topmost first conductive lines 105L may be designated as the first conductive pads 105P. The top surfaces of the first conductive pads 105P and the top surface of the first dielectric layer 107 may be substantially coplanar. The first conductive vias 105V may connect adjacent first conductive lines 105L along the direction Z, adjacent logic device element 103 and first conductive line 105L, and adjacent first conductive pad 105P and first conductive line 105L. In some embodiments, the first conductive features 105 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The first conductive features 105 may be formed during the formation of the first dielectric layer 107.

In some embodiments, the logic device elements 103 and the first conductive features 105 may together configure functional units of the optical semiconductor device 1A. A functional unit, in the description of the present disclosure, generally refers to functionally related circuitry that has been partitioned for functional purposes into a distinct unit. In some embodiments, the functional units of the logic die 100 may include, for example, highly complex circuits such as processor cores, memory controllers, or accelerator units.

In some embodiments, the functional units of the logic die 100 may include control circuit and high-speed circuitry that are associated with the memory die 200 which will be illustrated later.

In some embodiments, the functional units of the logic die 100 may include processor core intellectual properties, analog-to-digital converters, digital-to-analog converters, and phase-locked loops.

In some embodiments, the functional units may be located at the core circuit area LCA. In some embodiments, the functional units may be located at the core circuit area LCA and the logic peripheral circuit area LPA.

It should be noted that, in the description of the present disclosure, the term "front" surface is a term of art implying the major surface of the structure upon which is formed device elements and conductive features. Likewise, the "back" surface of a structure is that major surface opposite to the face. For example, the top surface of the first dielectric layer 107 may be referred to as the front surface 100F of the logic die 100. The bottom surface of the first substrate 101 may be referred to as the back surface 100B of the logic die 100.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

Figure 3:
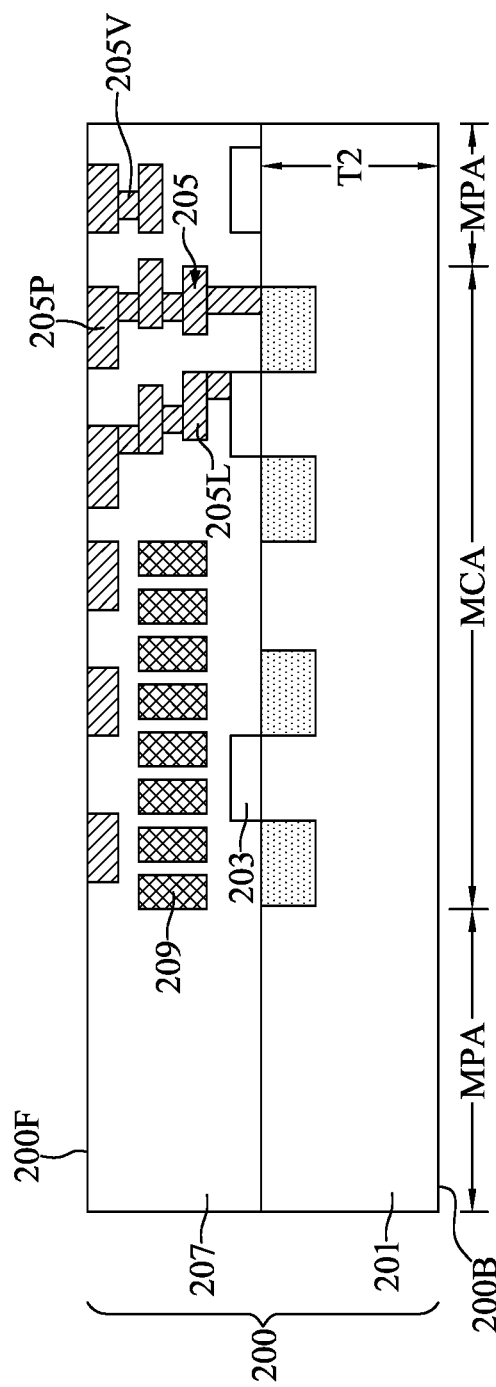

With reference to FIGS. 1 and 3, at step S13, a memory die 200 may be provided.

With reference to FIG. 3, the memory die 200 may include a second substrate 201, a plurality of memory device elements 203, plurality second conductive features 205, a second dielectric layer 207, and a plurality of storage units 209.

With reference to FIG. 3, the second substrate 201 may be a bulk semiconductor substrate. The bulk semiconductor substrate may be formed of, for example, an elementary semiconductor such as silicon or germanium, or a compound semiconductor such as silicon germanium, silicon carbide, gallium arsenide, gallium phosphide, indium phosphide, indium arsenide, indium antimonide, or other III-V compound semiconductor or II-VI compound semiconductor.

In some embodiments, the thickness T2 of the second substrate 201 may be between about 500 µm and about 700 µm. For example, the thickness T2 of the second substrate 201 may be about 600 µm.

With reference to FIG. 3, the second substrate 201 may include a memory cell area MCA and a memory peripheral area MPA. In some embodiments, the memory peripheral area MPA may be next to the memory cell area MCA. In some embodiments, in a top-view perspective (not shown), the memory cell area MCA may be the central region of the second substrate 201. The memory peripheral area MPA may be the peripheral region of the second substrate 201 which is surrounding the central region.

With reference to FIG. 3, the memory device elements 203 may be formed on the second substrate 201. Some portions of the memory device elements 203 may be formed in the second substrate 201. The memory device elements 203 may be transistors such as complementary metal-oxide-semiconductor transistors, metal-oxide-semiconductor field-effect transistors, fin field-effect-transistors, the like, or a combination thereof.

With reference to FIG. 3, the second dielectric layer 207 may be formed on the second substrate 201. In some embodiments, the second dielectric layer 207 may be a stacked layer structure. The second dielectric layer 207 may include a plurality of insulating sub-layers. Each of the insulating sub-layers may have a thickness between about 0.5 µm and about 3.0 µm. The insulating sub-layers may be formed of, for example, silicon oxide, borophosphosilicate glass, undoped silicate glass, fluorinated silicate glass, low-k dielectric materials, the like, or a combination thereof. The insulating sub-layers may be formed of different materials but are not limited thereto.

The insulating sub-layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

With reference to FIG. 3, the second conductive features 205 may be formed in the second dielectric layer 207. The second conductive features 205 may include second conductive lines 205L, second conductive vias 205V, and second conductive pads 205P. The second conductive lines 205L may be separated from each other and may be horizontally disposed in the second dielectric layer 207 along the direction Z. In the present embodiment, the topmost second conductive lines 205L may be designated as the second conductive pads 205P. The top surfaces of the second conductive pads 205P and the top surface of the second dielectric layer 207 may be substantially coplanar. The second conductive vias 205V may connect adjacent second conductive lines 205L along the direction Z, adjacent memory device element 203 and second conductive line 205L, and adjacent second conductive pad 205P and second conductive line 205L. In some embodiments, the second conductive features 205 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The second conductive features 205 may be formed during the formation of the second dielectric layer 207.

With reference to FIG. 3, the storage units 209 may be formed in the second dielectric layer 207 and above the memory cell area MCA. Each of the storage units 209 may include an insulator-conductor-insulator structure and may be electrically coupled to the corresponding second conductive pads 205P and the corresponding memory device elements 203, respectively and correspondingly.

In some embodiments, the memory device elements 203, the second conductive features 205, and the storage units 209 may together configure functional units of the memory die 200. In some embodiments, the functional units of the memory die 200 may only include core storage circuitry such as I/O and clocking circuit. The functional units of the memory die 200 may not include any control circuit or high-speed circuitry.

With reference to FIG. 3, the top surface of the second dielectric layer 207 may be referred to as the front surface 200F of the memory die 200. The bottom surface of the second substrate 201 may be referred to as the back surface 200B of the memory die 200.

Figure 4:
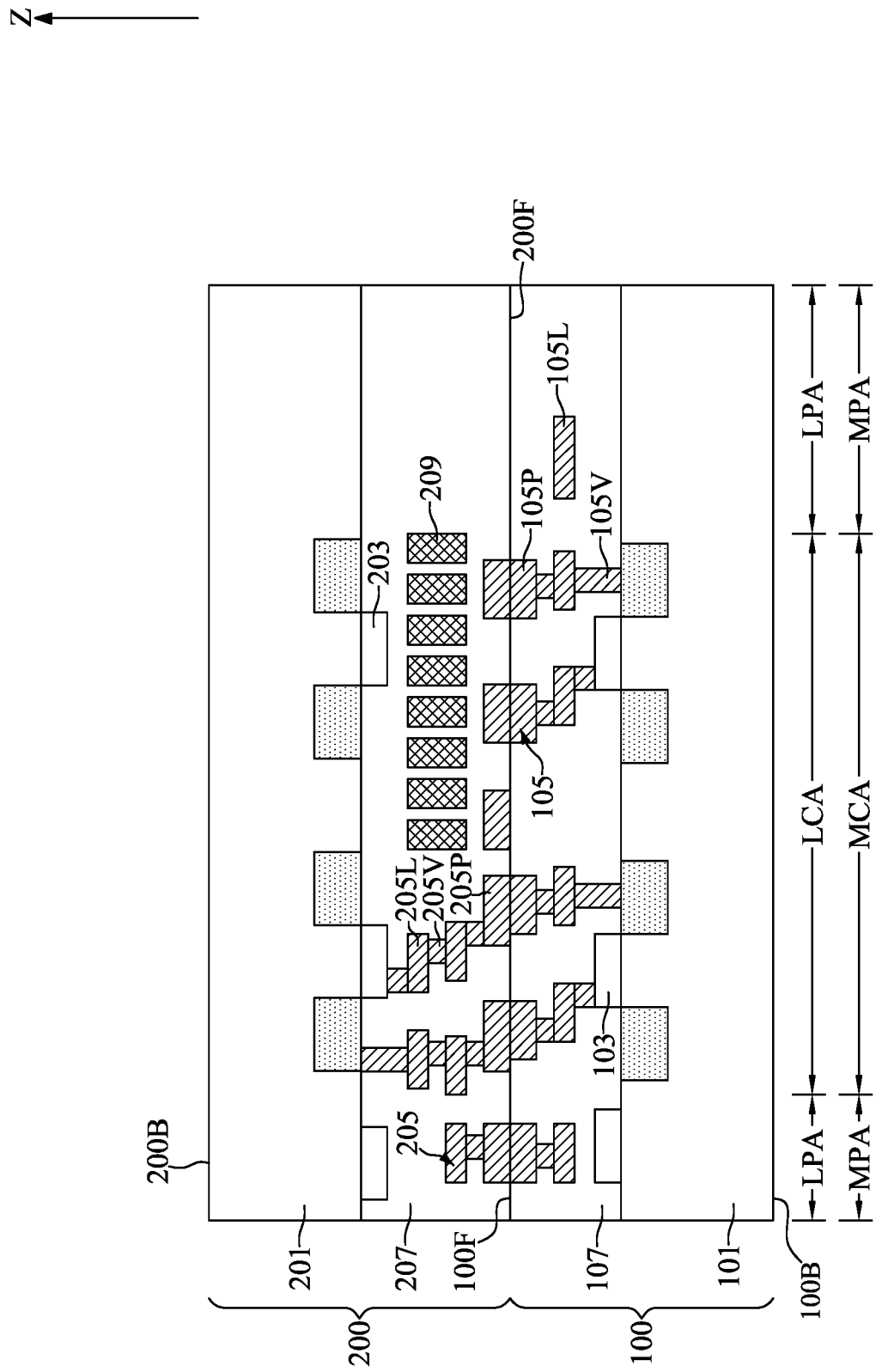
Figure 5:
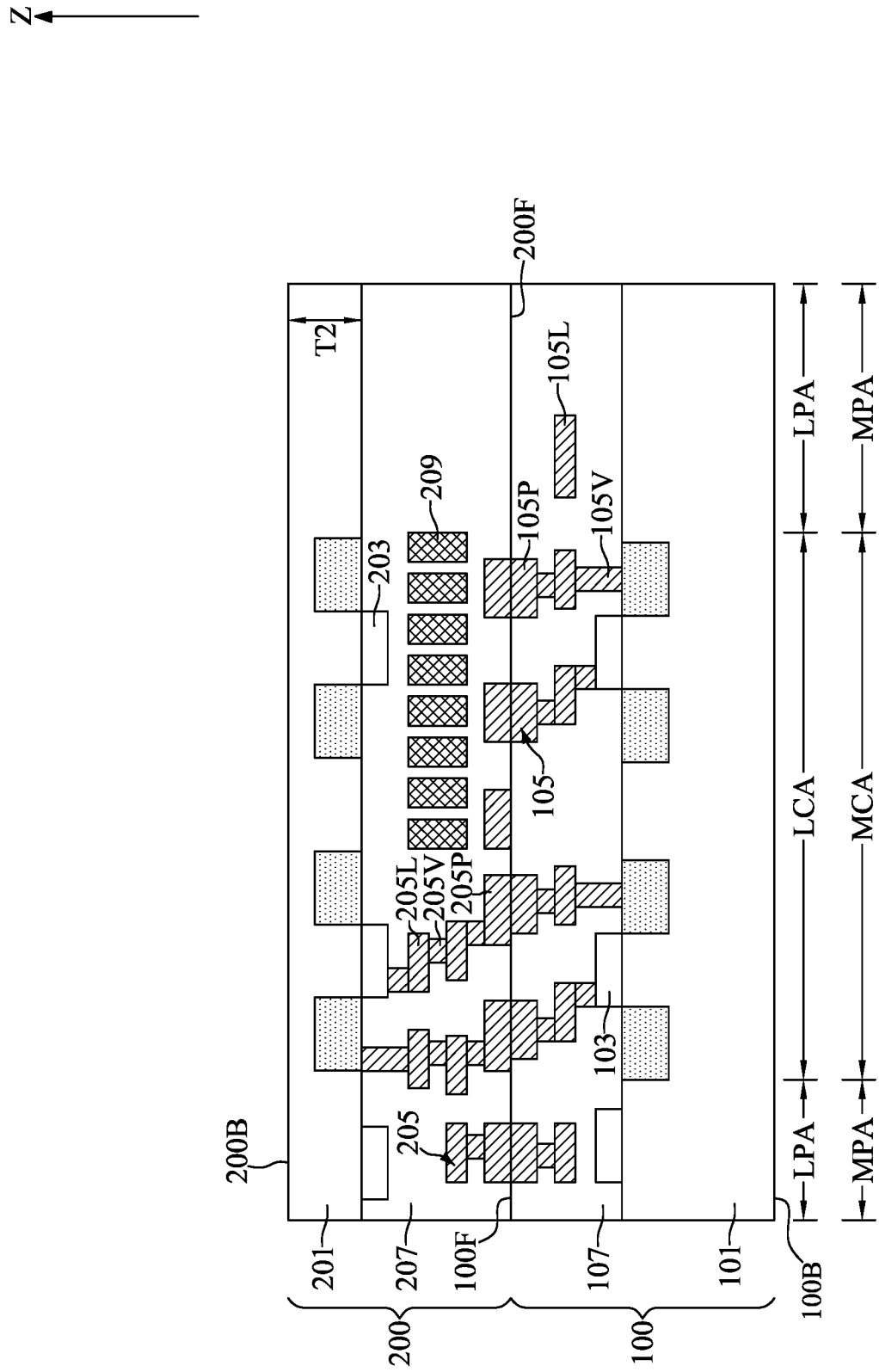

With reference to FIGS. 1, 4, and 5, at step S15, the memory die 200 may be bonded onto the logic die 100, and a thinning process may be performed to the memory die 200.

With reference to FIG. 4, the memory die 200 may be flipped. The front surface 200F of the memory die 200 may be bonded onto the front surface 100F of the logic die 100. That is, the memory die 200 and the logic die 100 are bonded in a face-to-face manner. In some embodiments, the memory die 200 and the logic die 100 may be bonded through a hybrid bonding process. In some embodiments, the hybrid bonding process such as thermo-compression bonding, passivation-capping-layer assisted bonding, or surface activated bonding. In some embodiments, the process pressure of the hybrid bonding process may be between about 100 MPa and about 150 MPa. In some embodiments, the process temperature of the hybrid bonding process may be between about room temperature (e.g., 25° C.) and about 400° C. In some embodiments, surface treatments such as wet chemical cleaning and gas/vapor-phase thermal treatments may be used to lower the process temperature of the hybrid bonding process or to short the time consuming of the hybrid bonding process. In some embodiments, the hybrid bonding process may include, for example, dielectric-to-dielectric bonding, metal-to-metal bonding, and metal-to-dielectric bonding.

In some embodiments, the dielectric-to-dielectric bonding may originate from the bonding between the first dielectric layer 107 and the second dielectric layer 207. The metal-to-metal bonding may originate from the bonding between the first conductive pads 105P and the second conductive pads 205P. The metal-to-dielectric bonding may originate from the bonding between the first conductive pads 105P and the second dielectric layer 207 and between the second conductive pads 205P and the first dielectric layer 107.

In some embodiments, a thermal annealing process may be performed after the bonding process to enhance dielectric-to-dielectric bonding and to induce thermal expansion of metal-to-metal bonding so as to further improve the bonding quality.

In some embodiments, the bonding process of the logic die 100 and the memory die 200 may be assisted with a carrier but is not limited thereto.

With reference to FIG. 5, the second substrate 201 of the memory die 200 may be thinning through a thinning process using wafer grinding, mechanical abrasion, polishing, or the like, or using chemical removal, such as a wet etch. In some embodiments, the thinning process of the memory die 200 may be assisted with a carrier but is not limited thereto. After the thinning process, the thickness T2 of the second substrate 201 may be between about 5 µm and 100 µm.

Figure 6:
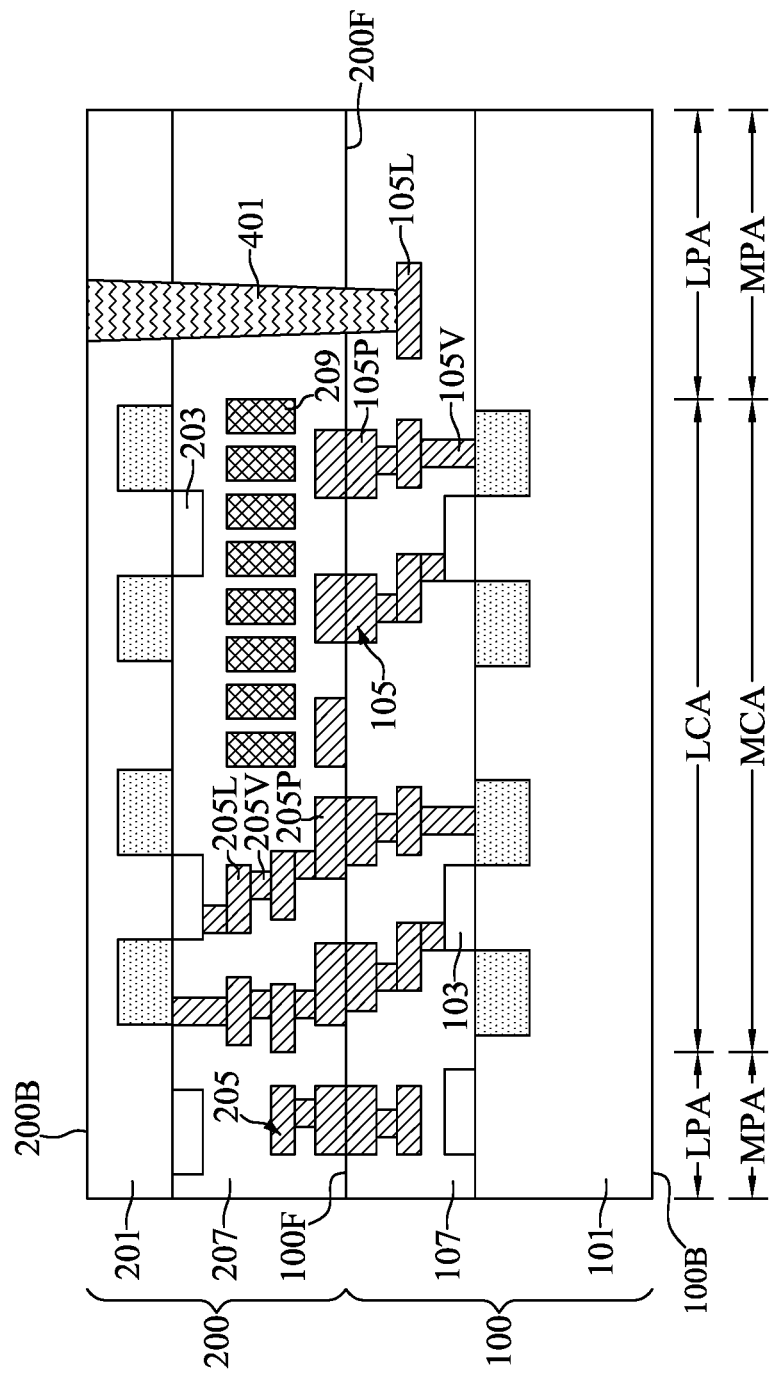
Figure 7:
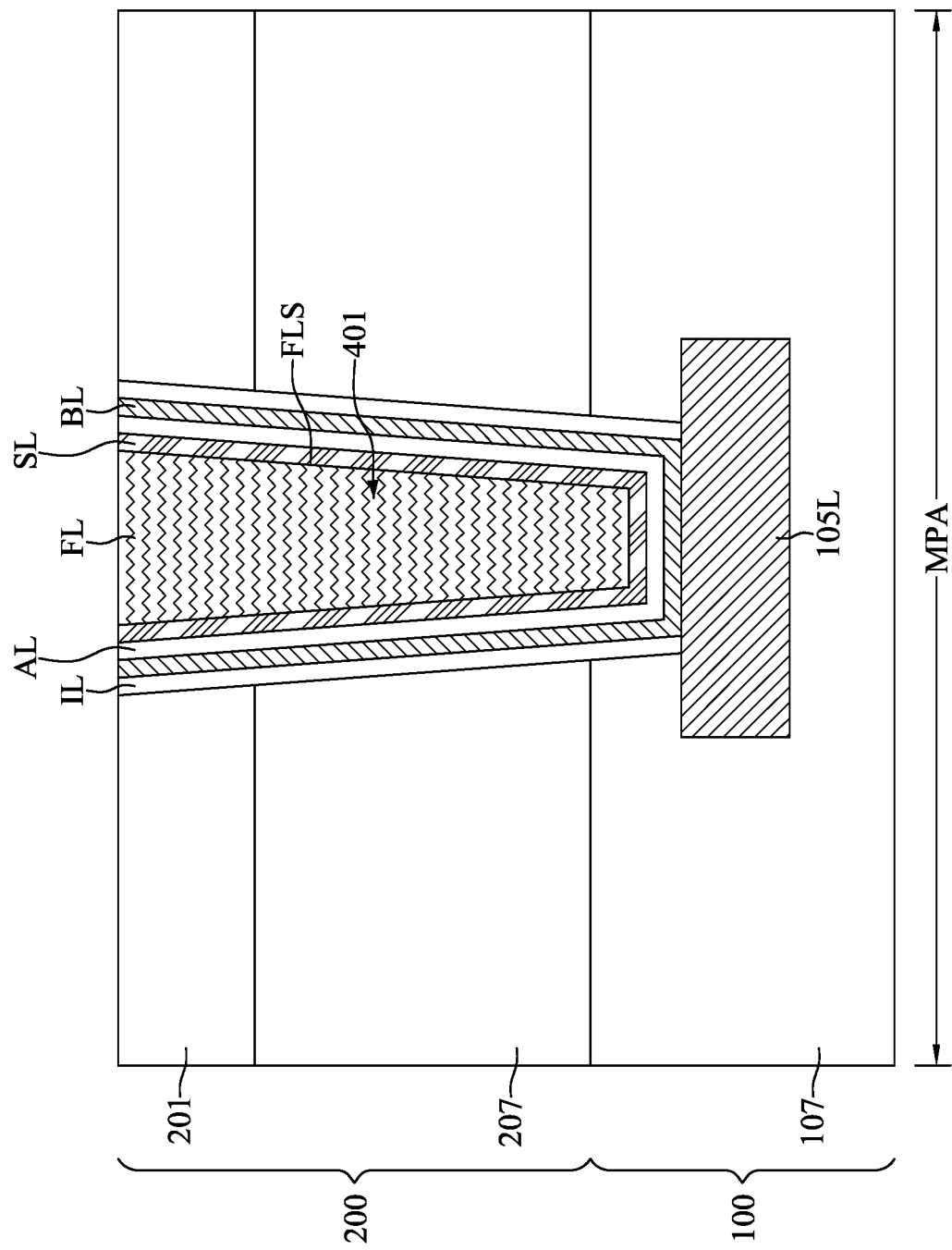
FIG. 7 illustrates, in a schematic close-up cross-sectional view diagram, a first inter-die via of the optical semiconductor device in accordance with one embodiment of the present disclosure.

With reference to FIGS. 1, 6, and 7, at step S17, a first inter-die via 401 may be formed along the memory die 200 and extending to the logic die 100.

With reference to FIGS. 6 and 7, the first inter-die via 401 may be formed along the second substrate 201 and the second dielectric layer 207, extending to the first dielectric layer 107, disposed on the corresponding first conductive line 105L, and electrically connected to the corresponding first conductive line 105L. In some embodiments, the first inter-die via 401 may be formed along the second substrate 201 and the second dielectric layer 207, disposed on the corresponding first conductive pad 105P, and electrically connected to the corresponding first conductive pad 105P (not shown).

In some embodiments, the first inter-die via 401 may include a filler layer FL, a seed layer SL, an adhesion layer AL, a barrier layer BL, and an isolation layer IL.

With reference to FIG. 7, in some embodiments, the filler layer FL may be formed along the second substrate 201 and the second dielectric layer 207, extending to the first dielectric layer 107, disposed on the corresponding first conductive line 105L, and electrically connected to the corresponding first conductive line 105L. The filler layer FL may be formed of, for example, doped polysilicon, tungsten, copper, carbon nanotube, or solder alloy.

In some embodiments, the isolation layer IL may be formed between the filler layer FL and the second substrate 201, between the filler layer FL and the second dielectric layer 207, between the filler layer FL and the first dielectric layer 107, and formed on the first conductive line 105L. In some embodiments, the isolation layer IL may be formed of, for example, silicon oxide, silicon nitride, silicon oxynitride, or tetra-ethyl ortho-silicate. The isolation layer IL may have a thickness between about 50 nm and about 200 nm. In some embodiments, the isolation layer IL may be formed of, for example, parylene, epoxy, or poly(p-xylene). The isolation layer IL may have a thickness between about 1 μm and about 5 μm. The isolation layer IL may ensure the filler layer FL is electrically isolated in the memory die 200 and the logic die 100.

With reference to FIG. 7, in some embodiments, the seed layer SL may have a U-shaped cross-sectional profile. The seed layer SL may be formed between the filler layer FL and the isolation layer IL. In some embodiments, the seed layer SL may have a thickness between about 10 nm and about 40 nm. In some embodiments, the seed layer SL may be formed of, for example, copper. The seed layer SL may reduce a resistivity of an opening during the formation of the filler layer FL.

With reference to FIG. 7, in some embodiments, the adhesion layer AL may have a U-shaped cross-sectional profile. The adhesion layer AL may be formed between the seed layer SL and isolation layer IL. The seed layer SL may be formed of, for example, titanium, tantalum, titanium tungsten, or manganese nitride. The seed layer SL may improve an adhesion between the seed layer SL and the barrier layer BL.

With reference to FIG. 7, in some embodiments, the barrier layer BL may have a U-shaped cross-sectional profile. The barrier layer BL may be between the adhesion layer AL and the isolation layer IL. The barrier layer BL may be formed of, for example, tantalum, tantalum nitride, titanium, titanium nitride, rhenium, nickel boride, or tantalum nitride/tantalum bilayer. The barrier layer BL may inhibit diffusion of the conductive materials of the filler layer FL into the second substrate 201, the second dielectric layer 207, and the first dielectric layer 107.

With reference to FIG. 1 and FIGS. 8 to 10, at step S19, an intervening structure 500 may be formed on the memory die 200, and a landing pad 503 may be formed in the intervening structure 500 and on the first inter-die via 401. In some embodiments, the intervening structure 500 includes a first layer 501A positioned on the memory die 200, a second layer 501B positioned on the first layer 501A, and a third layer 501C positioned on the second layer 501B.

In some embodiments, the first layer 501A and the second layer 501C include the same material, while the second layer 501B includes material different from the first layer 501A. In some embodiments, the first dielectric layer includes silicon oxide or silicon nitride, the second layer 501B includes silicon, and the third layer includes silicon oxide or silicon nitride.

Figure 8:
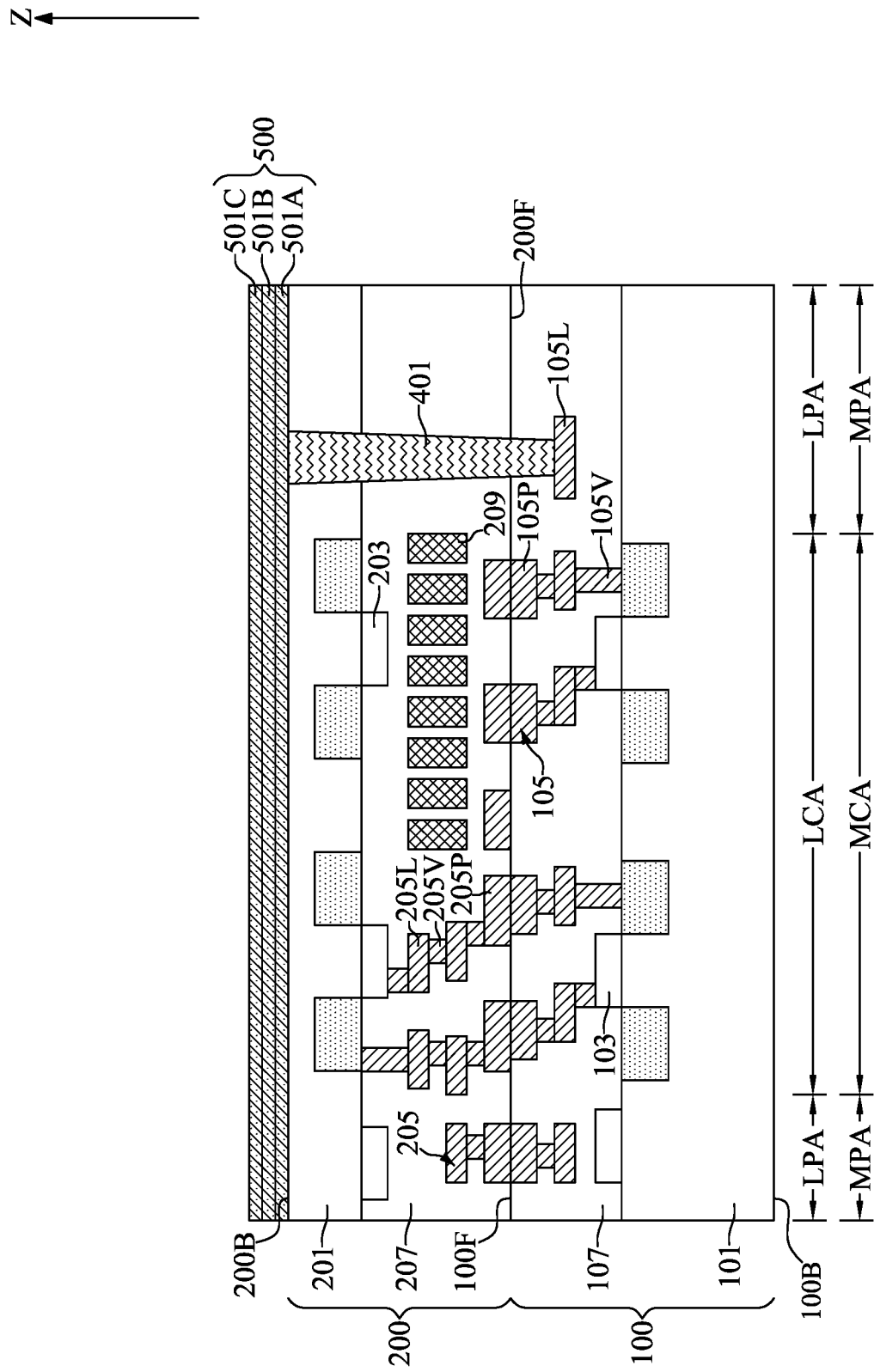
FIGS. 8 to 15 are schematic cross-sectional view diagrams illustrating part of the flow for fabricating the optical semiconductor device in accordance with one embodiment of the present disclosure.

With reference to FIG. 8, the intervening structure 500 may be formed on the second substrate 201. In some other embodiments, the intervening structure 500 may be a dielectric layer. The dielectric layer may include a nitride such as silicon nitride, an oxide such as silicon oxide, an oxynitride such as silicon oxynitride, silicon nitride oxide, phosphosilicate glass, borosilicate glass, boron-doped phosphosilicate glass, or the like, or a combination thereof. In some embodiments, the intervening structure 500 may include polybenzoxazole, polyimide, benzocyclobutene, ajinomoto buildup film, solder resist film, the like, or a combination thereof. The intervening structure 500 formed of polymeric material may have a number of attractive characteristics such as the ability to fill openings of high aspect ratio, a relatively low dielectric constant (about 3.2), a simple depositing process, the reduction of sharp features or steps in the underlying layer, and high temperature tolerance after curing.

In some embodiments, the intervening structure 500 may be formed by, for example, spin-coating, lamination, deposition, or the like. The deposition may include chemical vapor deposition such as plasma-enhanced chemical vapor deposition. The process temperature of the plasma-enhanced chemical vapor deposition may be between about 350° C. and about 450° C. The process pressure of the plasma-enhanced chemical vapor deposition may be between about 2.0 Torr and about 2.8 Torr. The process duration of the plasma-enhanced chemical vapor deposition may be between about 8 seconds and about 12 seconds.

Figure 9:
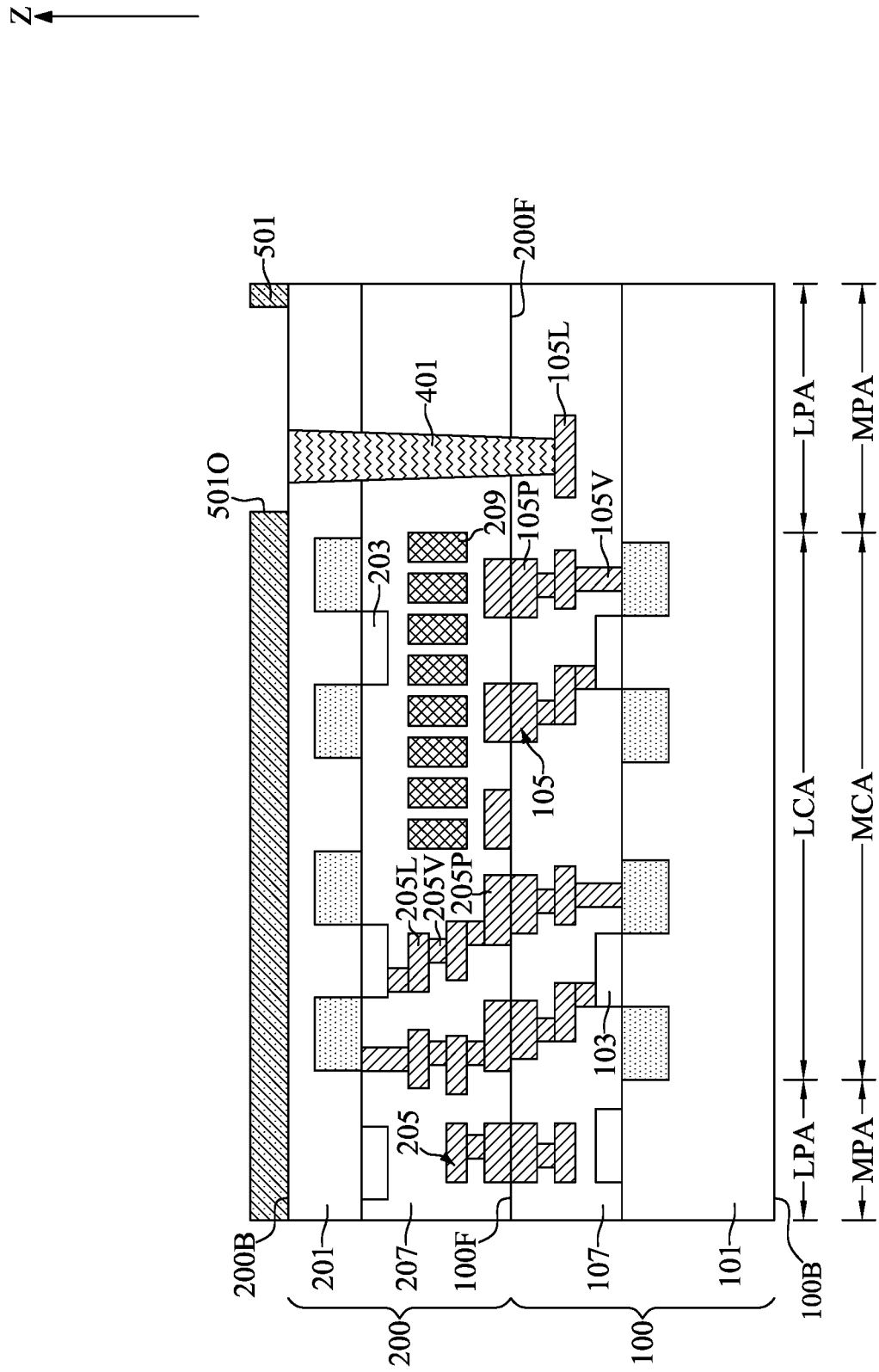
Figure 10:
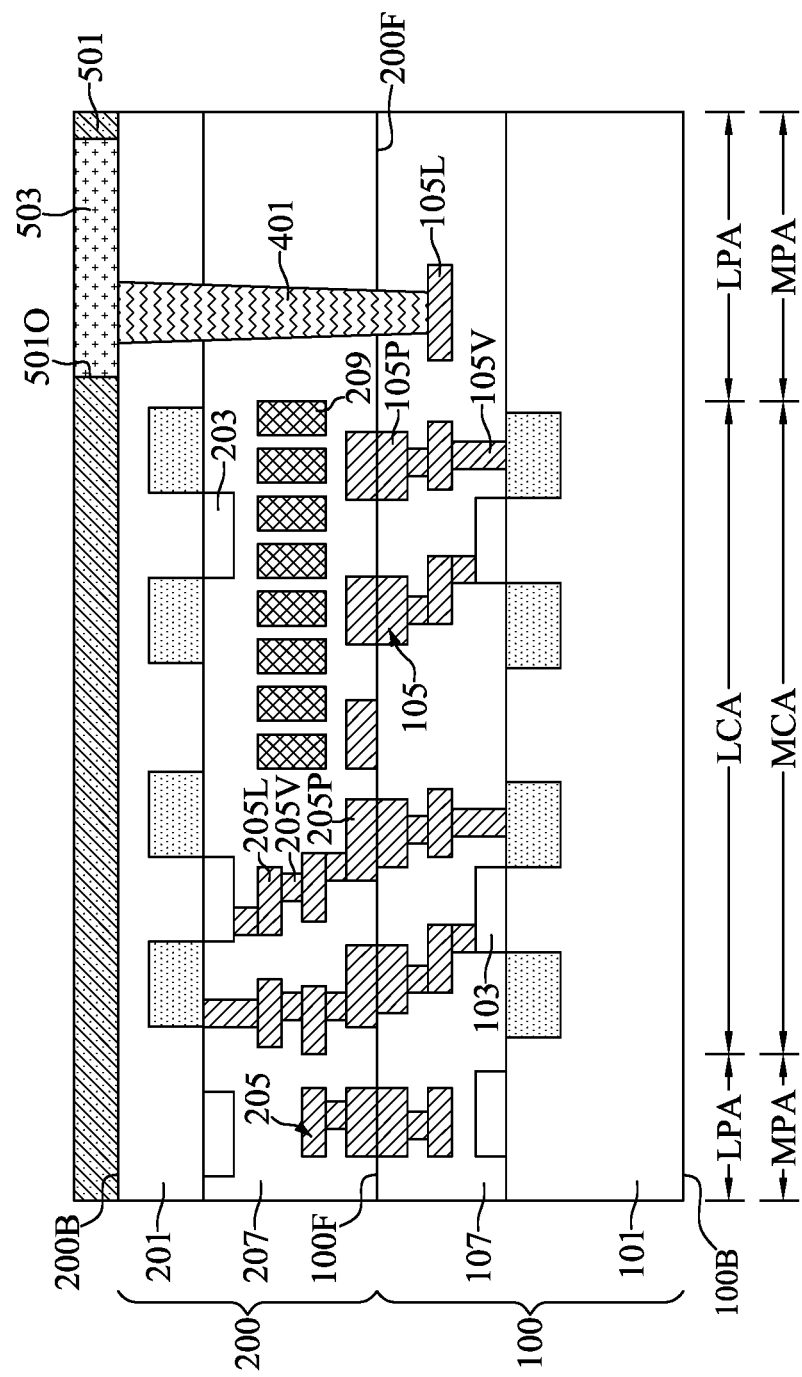

With reference to FIGS. 9 and 10, a landing pad opening 5010 may be formed in the intervening structure 500 and a conductive material may be formed to fill the landing pad opening 5010 to form the landing pad 503. The landing pad opening 5010 may be formed by a photolithography process and a subsequent etching process. The first inter-die via 401 may be exposed through the landing pad opening 5010. After the filling of the conductive material, a planarization process, such as chemical mechanical polishing, may be performed to remove excess material and provide a substantially flat surface for subsequent processing steps. The conductive material may be, for example, copper or other applicable conductive materials.

Figure 11:
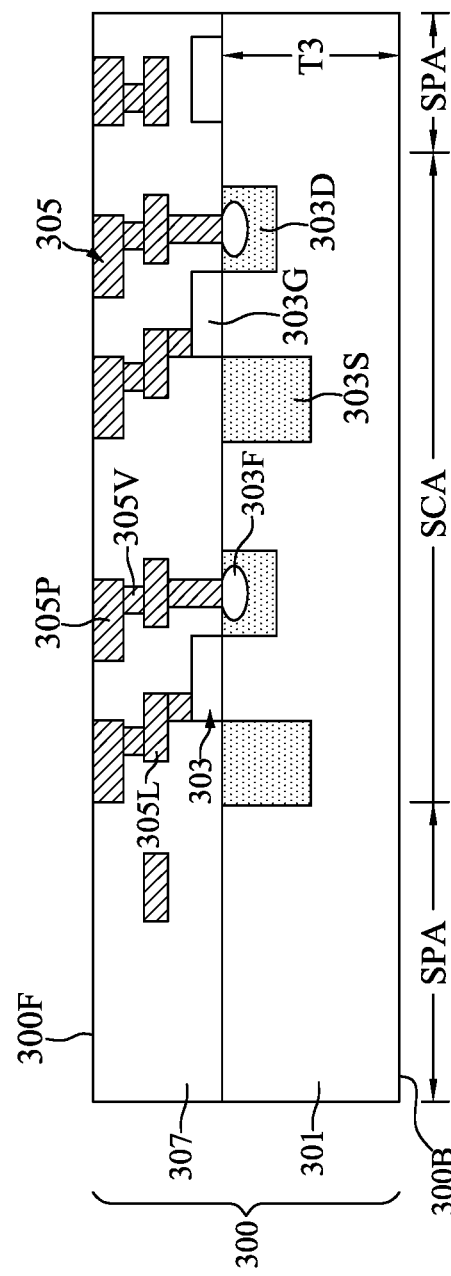

With reference to FIGS. 1 and 11, at step S21, a sensor die 300 may be provided.

With reference to FIG. 11, the sensor die 300 may include a third substrate 301, a plurality of sensor device elements 303, a plurality sensor conductive features 305, and a third dielectric layer 307.

With reference to FIG. 11, the third substrate 301 may be formed of a semiconductor or compound semiconductor. For example, the third substrate 301 may include silicon, germanium, silicon carbide, gallium arsenide, indium arsenide, or indium phosphide. The third substrate 301 may include a conductive region, for example, a well in which an impurity is doped, or a structure doped with an impurity. Also, the third substrate 301 may have various isolation structures, for example, a shallow trench isolation structure or a deep trench isolation structure.

In some embodiments, the thickness T3 of the third substrate 301 may be between about 500 μm and about 700 μm. For example, the thickness T3 of the third substrate 301 may be about 600 μm.

With reference to FIG. 11, the third substrate 301 may include a sensor pixel area SCA and a sensor peripheral area SPA. In some embodiments, the sensor peripheral area SPA may be next to the sensor pixel area SCA. In some embodiments, in a top-view perspective (not shown), the sensor pixel area SCA may be the central region of the third substrate 301. The sensor peripheral area SPA may be the peripheral region of the third substrate 301 which is surrounding the central region.

With reference to FIG. 11, the sensor device elements 303 may be formed on the third substrate 301. Some portions of the sensor device elements 303 may be formed in the third substrate 301. In some embodiments, the sensor device elements 303 may include transfer gates 303G, sensor units 303S, floating diffusion units 303F, and transistors such as complementary metal-oxide-semiconductor transistors, metal-oxide-semiconductor field-effect transistors, fin field-effect-transistors.

For brevity, clarity, and convenience of description, only one transfer gate 303G, one sensor unit 303S, and one floating diffusion unit 303F are described. In some embodiments, the transfer gate 303G, the sensor unit 303S, and the floating diffusion unit 303F are located at the sensor pixel area SCA. In some embodiments, the sensor unit 303S may be a photodiode and may be electrically coupled to the source of the transfer gate 303G. The floating diffusion unit 303F may be formed in the third substrate 301, for example, through implanting into substrate to form a p-n junction. In some embodiments, the floating diffusion unit 303F may be formed in the drain 303D of the transfer gate 303G. That is, the floating diffusion unit 303F may be electrically coupled to the drain 303D of the transfer gate 303G. In some embodiments, the other transistors may be configured as row selectors, source followers, and reset transistors.

With reference to FIG. 11, the third dielectric layer 307 may be formed on the third substrate 301. In some embodiments, the third dielectric layer 307 may be a stacked layer structure. The third dielectric layer 307 may include a plurality of insulating sub-layers. Each of the insulating sub-layers may have a thickness between about 0.5 μm and about 3.0 μm. The insulating sub-layers may be formed of, for example, silicon oxide, borophosphosilicate glass, undoped silicate glass, fluorinated silicate glass, low-k dielectric materials, the like, or a combination thereof. The insulating sub-layers may be formed of different materials but are not limited thereto.

With reference to FIG. 11, the sensor conductive features 305 may be formed in the third dielectric layer 307. The sensor conductive features 305 may be electrically coupled to the sensor device elements 303, respectively and correspondingly. The sensor conductive features 305 may include third conductive lines 305L, third conductive vias 305V, and third conductive pads 305P. The third conductive lines 305L may be separated from each other and may be horizontally disposed in the third dielectric layer 307 along the direction Z. In the present embodiment, the topmost third conductive lines 305L may be designated as the third conductive pads 305P. The top surfaces of the third conductive pads 305P and the top surface of the third dielectric layer 307 may be substantially coplanar. The third conductive vias 305V may connect adjacent third conductive lines 305L along the direction Z, adjacent sensor device element 303 and third conductive line 305L, and adjacent third conductive pad 305P and third conductive line 305L. In some embodiments, the sensor conductive features 305 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The sensor conductive features 305 may be formed during the formation of the third dielectric layer 307.

With reference to FIG. 11, the top surface of the third dielectric layer 307 may be referred to as the front surface 300F of the sensor die 300. The bottom surface of the sensor die 300 may be referred to as the back surface 300B of the sensor die 300.

Figure 12:
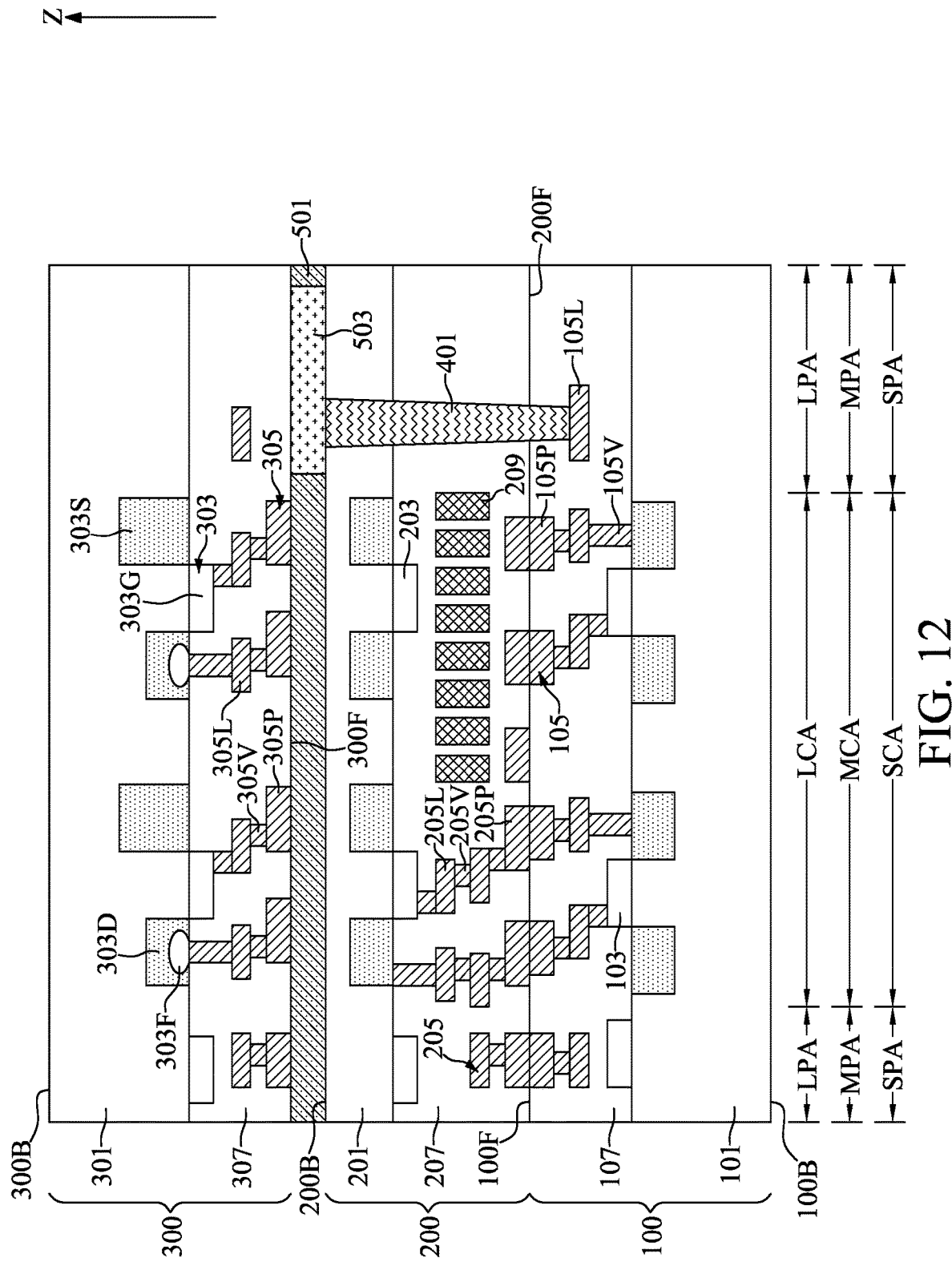

With reference to FIGS. 1 and 12, at step S23, the sensor die 300 may be bonded onto the intervening structure 500.

With reference to FIG. 12, the sensor die 300 may be flipped. The front surface 300F of the sensor die 300 may be bonded onto the intervening structure 500 through a bonding process. In some embodiments, the bonding process may be an oxide bonding process through the dielectric-to-dielectric bonding originated form the third dielectric layer 307 and the intervening structure 500.

Figure 13:
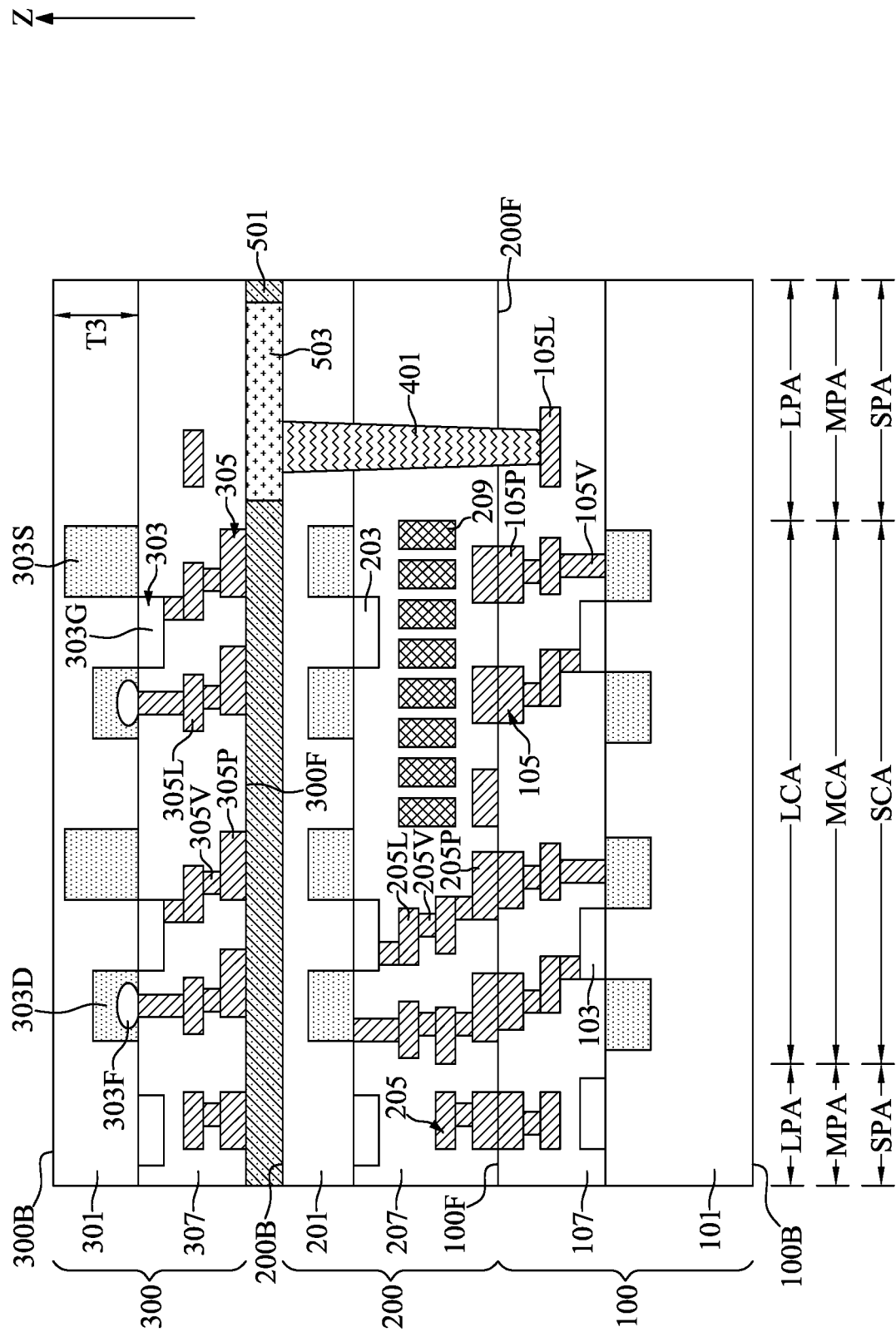
Figure 14:
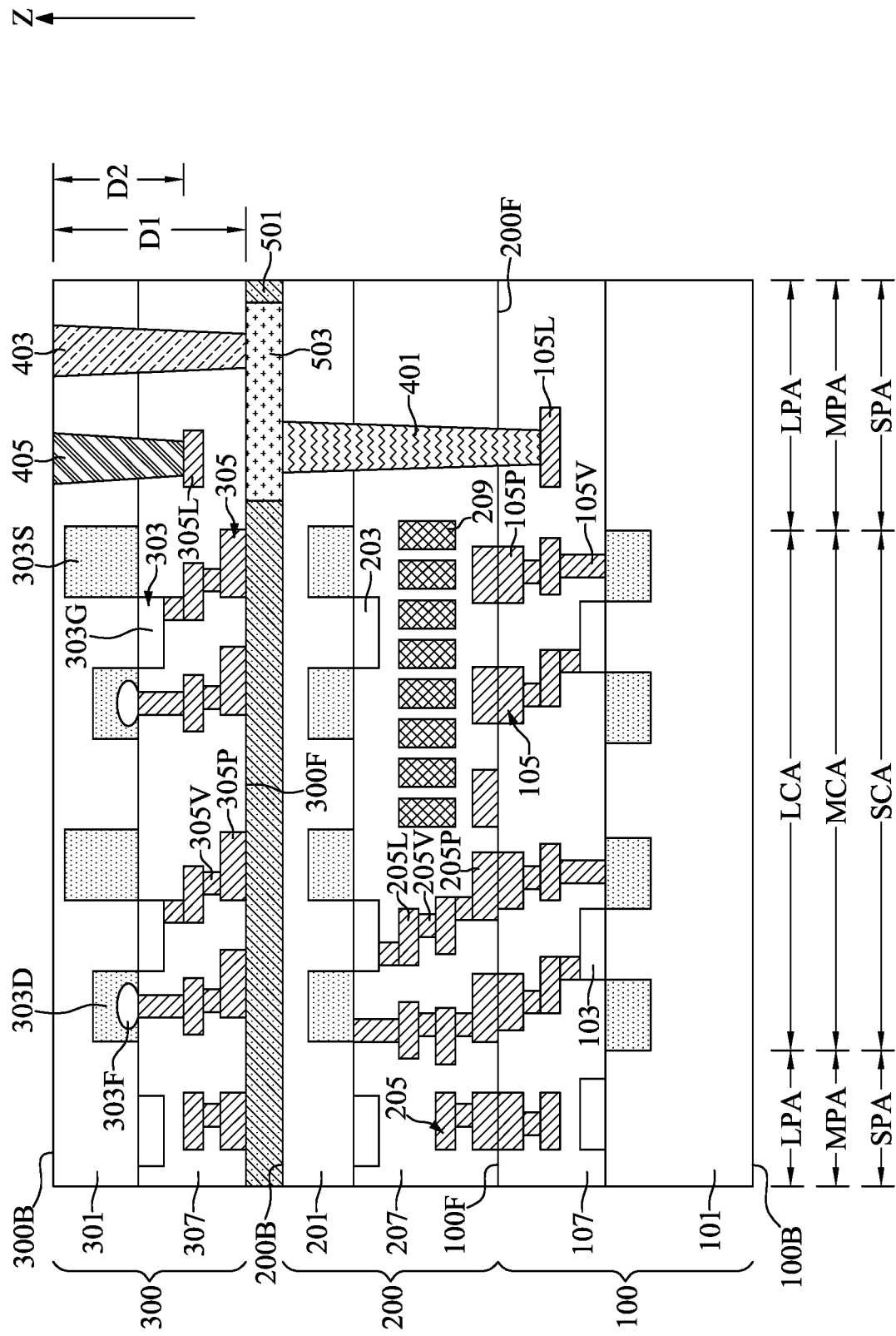

With reference to FIGS. 1, 13, and 14, at step S25, a thinning process may be performed to the sensor die 300, a first intra-die via 403 may be formed in the sensor die 300, and a second intra-die via 405 may be formed in the sensor die 300.

With reference to FIG. 13, the third substrate 301 of the sensor die 300 may be thinned through a thinning process using wafer grinding, mechanical abrasion, polishing, or the like, or using chemical removal, such as a wet etch. In some embodiments, the thinning process of the sensor die 300 may be assisted with a carrier but is not limited thereto. After the thinning process, the thickness T3 of the third substrate 301 may be between about 5 μm and 100 μm. With the third substrate 301 having a small thickness, light may penetrate from back surface 300B into third substrate 301, and reach sensor unit 303S.

With reference to FIG. 14, the first intra-die via 403 may be formed along the third substrate 301 and the third dielectric layer 307, and on the landing pad 503. The first intra-die via 403 may be electrically connected to the landing pad 503. That is, the first intra-die via 403 may be electrically coupled to the logic die 100 through the landing pad 503 and the first inter-die via 401. The second intra-die via 405 may be formed along the third substrate 301, extending to the third dielectric layer 307, and on the corresponding third conductive line 305L. The height D1 of the first intra-die via 403 may be greater than the height D2 of the second intra-die via 405. In some embodiments, the height ratio of the height D1 of the first intra-die via 403 to the height D2 of the second intra-die via 405 may be between about 10:3 and about 5:4. In some embodiments, the first intra-die via 403 and the second intra-die via 405 may be electrically coupled to each other.

In some embodiments, the first intra-die via 403 and the second intra-die via 405 may have structures similar to the first inter-die via 401, and descriptions thereof are not repeated herein.

Figure 15:
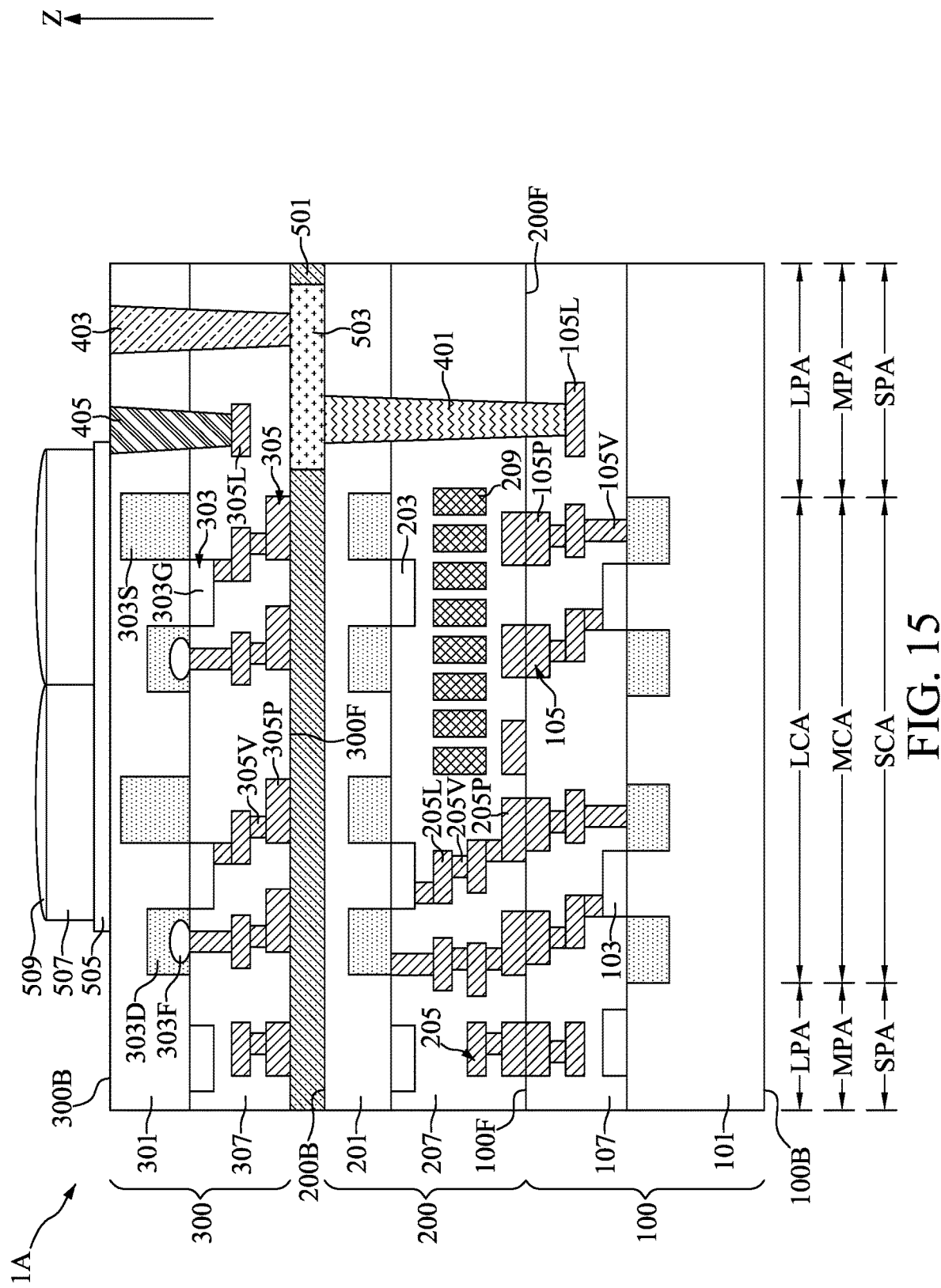

With reference to FIGS. 1 and 15, at step S27, an upper layer 505 may be formed on the sensor die 300, a plurality of color filters 507 may be formed on the upper layer 505, and a plurality of micro-lenses 509 may be formed on the plurality of color filters 507.

With reference to FIG. 15, the upper layer 505 may be formed on the sensor pixel area SCA. The upper layer 505 may cover the sensor units 303S in a top-view perspective (not shown). In some embodiments, the upper layer 505 may include one or more of a bottom anti-reflective coating, a silicon oxide layer, and a silicon nitride layer.

With reference to FIG. 15, the color filters 507 may include, for example, a red filter, a blue filter, and a green filter. In some embodiments, the color filters 507 may include a cyan filter, a yellow filter, and a magenta filter. The color filter 507 may be topographically aligned with the corresponding sensor unit 303S. The sensor unit 303S may detect components of incident light that are separated from each other to realize the color. The micro-lenses 509 may concentrate incident light in the sensor pixel area SCA on the sensor unit 303S. When the sensor units 303S include photodiodes, the micro-lenses 509 may concentrate incident light in the sensor pixel area SCA on the photodiodes.

It should be noted that, in the description of the present disclosure, an x-y-z coordinate system is assumed where x and y refer to directions (dimensions) within the plane parallel to the major surface of the structure and z refers a direction (dimension) perpendicular to the plane, two features are topographically aligned when those features have substantially the same x, y coordinates.

With reference to FIG. 15, the logic die 100, the memory die 200, the sensor die 300, the first inter-die via 401, the first intra-die via 403, the second intra-die via 405, the intervening structure 500, the landing pad 503, the upper layer 505, the color filters 507, and the micro-lenses 509 together configure the optical semiconductor device 1A.

In some embodiments, the optical semiconductor device 1A may be configured as an optical sensor device to detect images. The sensor unit 303S (e.g., photodiode) may receive light (for example, visible rays or infrared rays) from the outside and may produce photocharges based on the received light. The photocharges produced by the sensor unit 303S may be transferred to the floating diffusion unit 303F via the channel of the transfer gate 303G and the photocharges produced by the sensor unit 303S may be stored in the floating diffusion unit 303F.

In some embodiments, the reset transistor of the sensor die 300 may receive a reset signal. When the reset signal is activated, the charges accumulated in the floating diffusion unit 303F may be discharged to reset the floating diffusion unit 303F.

In some embodiments, the functional units of the logic die 100 may perform various operations to provide a digital image signal from the images captured by the optical semiconductor device 1A. For example, various post processing algorithms may be executed by the logic die 100. Examples of the post processing algorithms included but are not limited to contrast enhancement, sharpness enhancement, or noise reduction. An output from the logic die 100 may be supplied by a video codec processor. An image processed by the video codec processor may be output to the display or stored in the memory die 200.

By employing the first inter-die via 401, the first intra-die via 403, the second intra-die via 405, the signal produced in the sensor die 300 may be transferred to the functional circuits of the logic die 100 to perform various processing which usually needs complicate circuits. In other words, the sensor die 300 can only reserve the essential elements for optical sensing function to simplify the complexity of fabrication of the sensor die 300. As a result, the yield of the optical semiconductor device 1A may be improved. In addition, the first inter-die via 401, the first intra-die via 403, and the second intra-die via 405 may also shorten the signal path between the function circuits of different dies so that the energy consumption for signal transferring may be reduced. Furthermore, by further integrating the memory die 200, the intermediate processing or the post processing signal may be easily stored.

In some embodiments, the bonding of the logic die 100, the memory die 200, and the sensor die 300 may be at wafer level. In the wafer-level bonding, wafers, which may include the logic die 100, the memory die 200, and the sensor die 300, respectively, may be bonded together, and may then sawed into dies. Alternatively, the bonding may be performed at the chip level.

Figure 16:
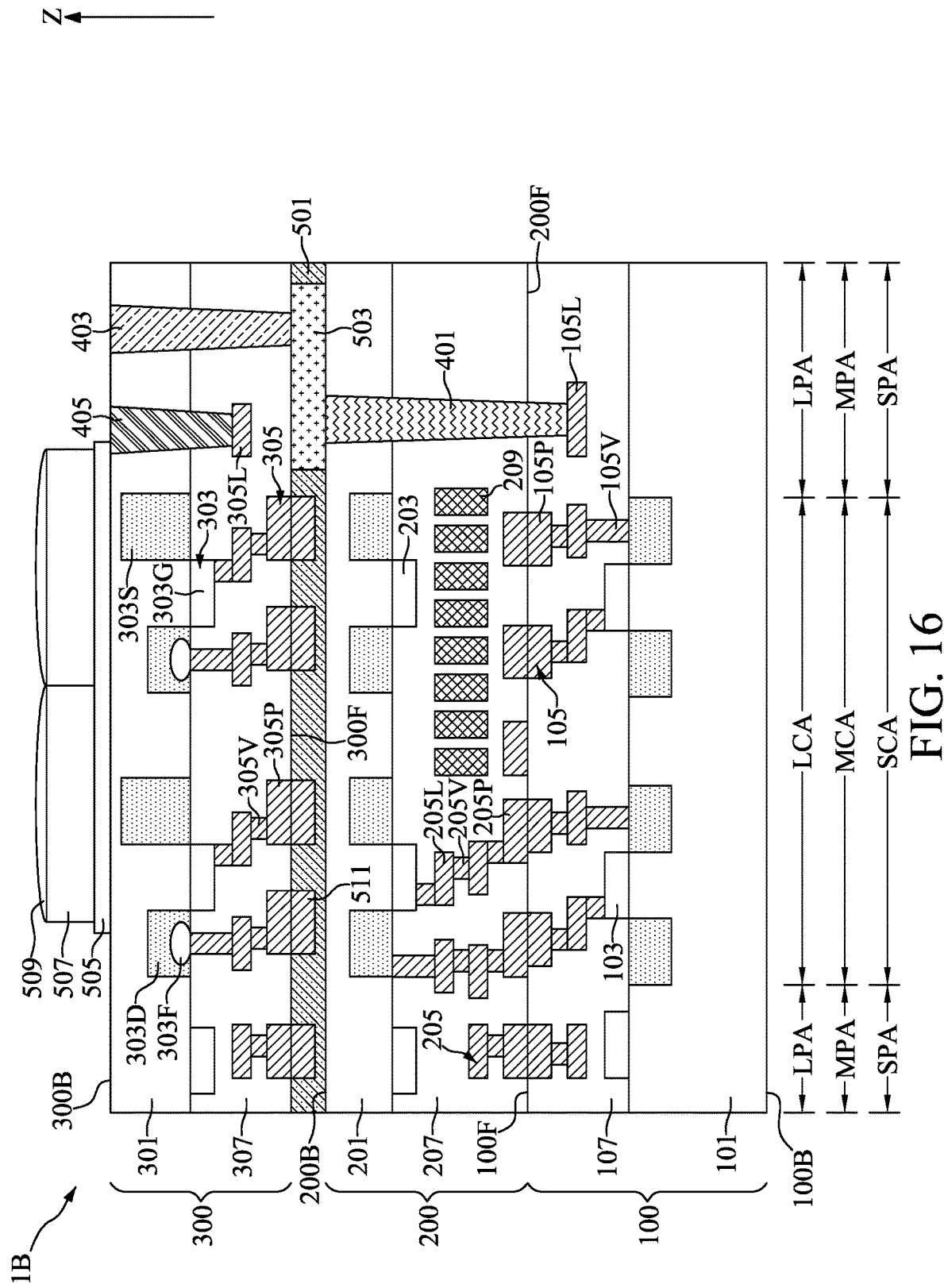
FIG. 16 illustrates, in a schematic cross-sectional view diagram, an optical semiconductor device in accordance with another embodiment of the present disclosure.

FIG. 16 illustrates, in a schematic cross-sectional view diagram, an optical semiconductor device 1B in accordance with another embodiment of the present disclosure.

With reference to FIG. 16, the optical semiconductor device 1B may have a structure similar to that illustrated in FIG. 15. The same or similar elements in FIG. 16 as in FIG. 15 have been marked with similar reference numbers and duplicative descriptions have been omitted. The optical semiconductor device 1B may include a plurality of assistance conductive pads 511 disposed in the intervening structure 500 and contacting the third conductive pads 305P, respectively and correspondingly. The assistance conductive pads 511 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The assistance conductive pads 511 may improve the bonding strength between the intervening structure 500 and the sensor die 300 by providing additional metal-to-metal bondings.

Figure 17:
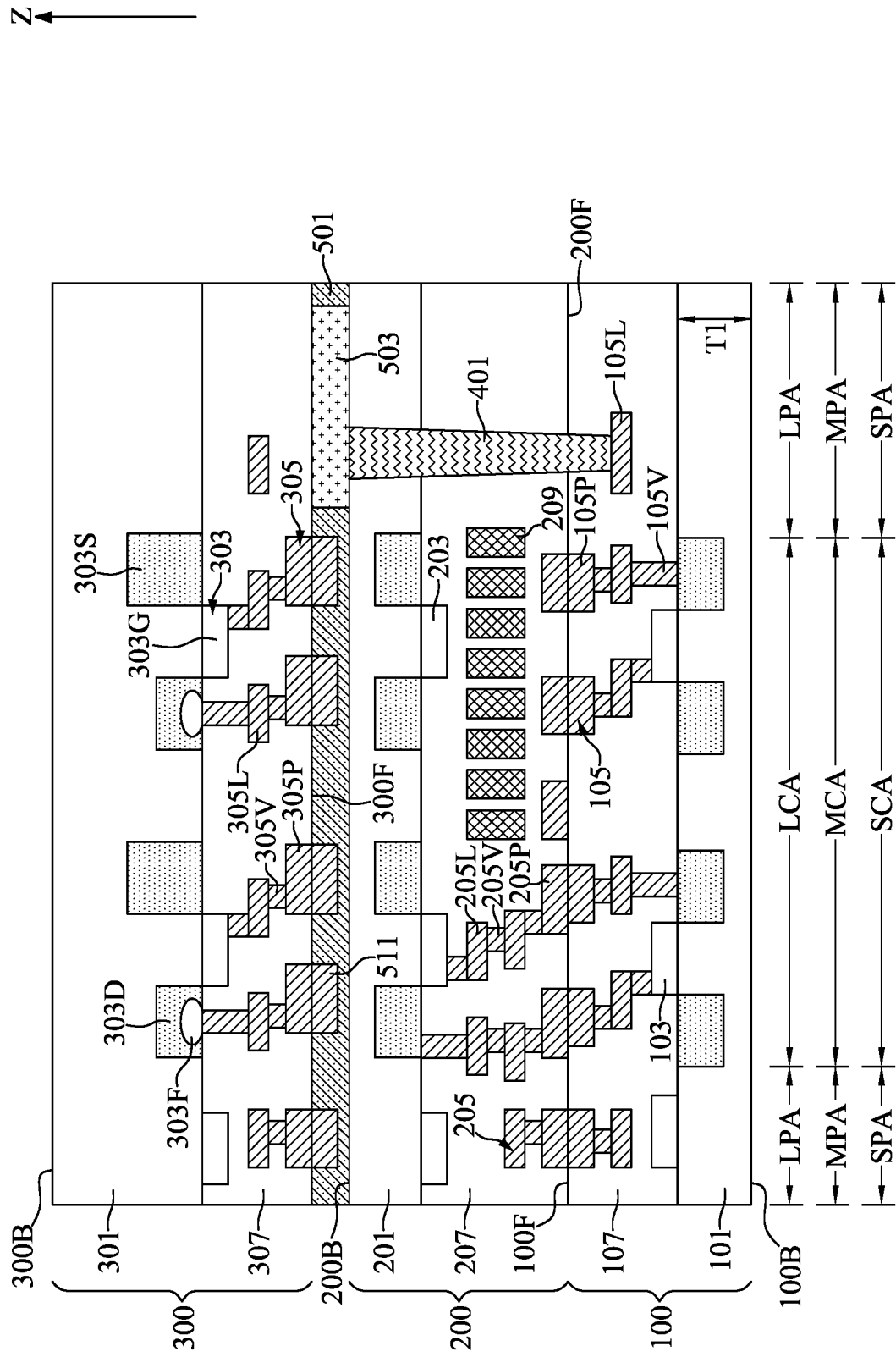
FIGS. 17 and 18 are schematic cross-sectional view diagrams illustrating part of a flow for fabricating the optical semiconductor device in accordance with another embodiment of the present disclosure.
Figure 18:
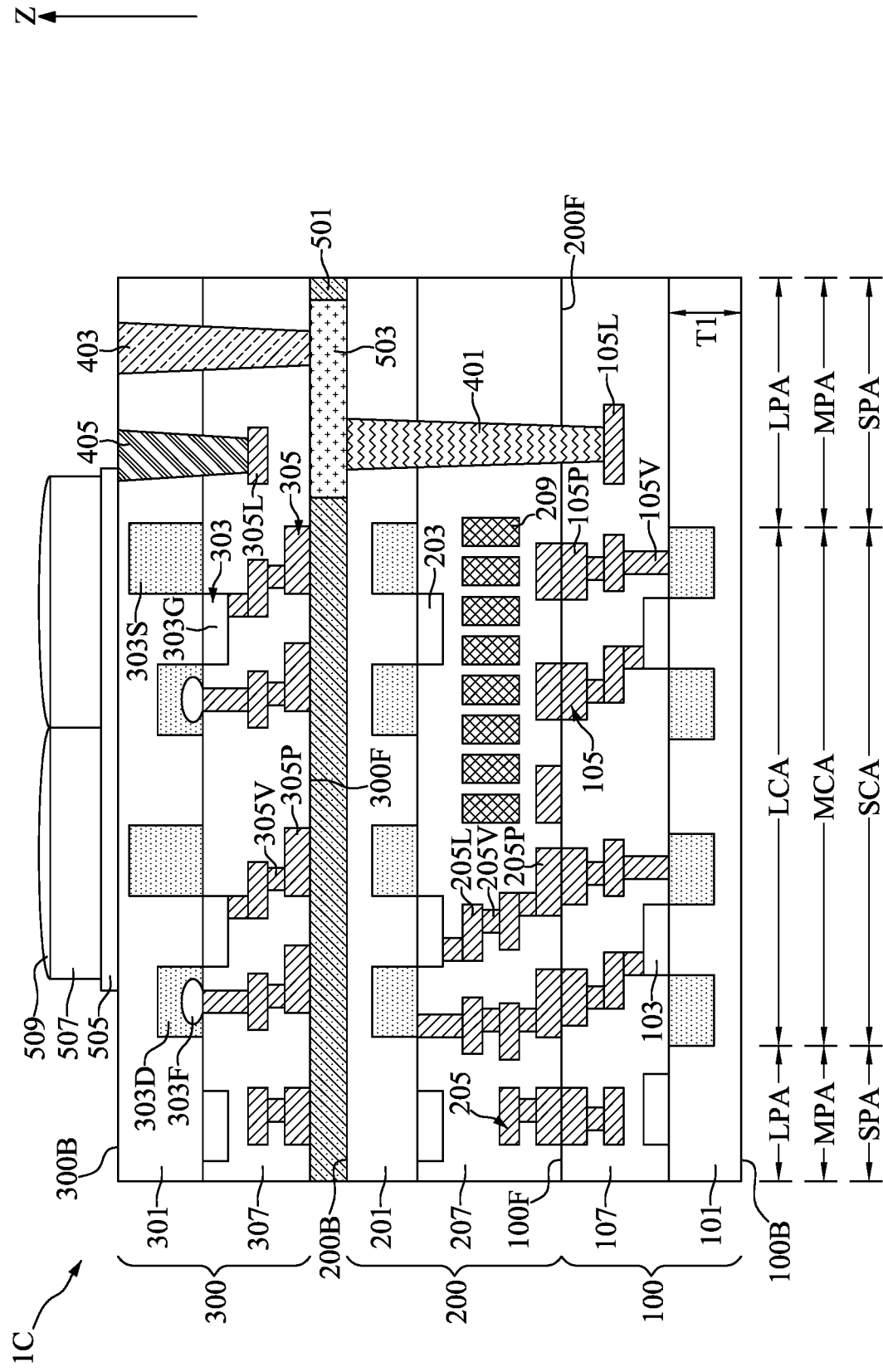

FIGS. 17 and 18 are schematic cross-sectional view diagrams illustrating part of a flow for fabricating the optical semiconductor device 1C in accordance with another embodiment of the present disclosure.

With reference to FIG. 17, an intermediate optical semiconductor device may be fabricated with a procedure similar to that illustrated in FIGS. 2 to 12, and descriptions thereof are not repeated herein. The first substrate 101 of the logic die 100 may be thinned through a thinning process using wafer grinding, mechanical abrasion, polishing, or the like, or using chemical removal, such as a wet etch. In some embodiments, the thinning process of the first substrate 101 may not be performed with a carrier. The memory die 200, the intervening structure 500, and the sensor die 300 may serve as a temporary carrier to prevent the logic die 100 from breaking even through the logic die 100 has a small thickness during and after the thinning process of the first substrate 101. After the thinning process, the thickness T1 of the first substrate 101 may be between about 5 μm and 100 μm or less than about 10 μm.

With reference to FIG. 18, the thinning process of the third substrate 301, the fabrication of the first intra-die via 403, the second intra-die via 405, the upper layer 505, the color filters 507, and the micro-lenses 509 may be similar to a procedure that illustrates in FIGS. 13 to 15, and descriptions thereof are not repeated herein. Because a carrier is not necessary during the thinning process of the first substrate 101, the cost and process complexity of fabricating the optical semiconductor device 1C may be reduced.

Figure 19:
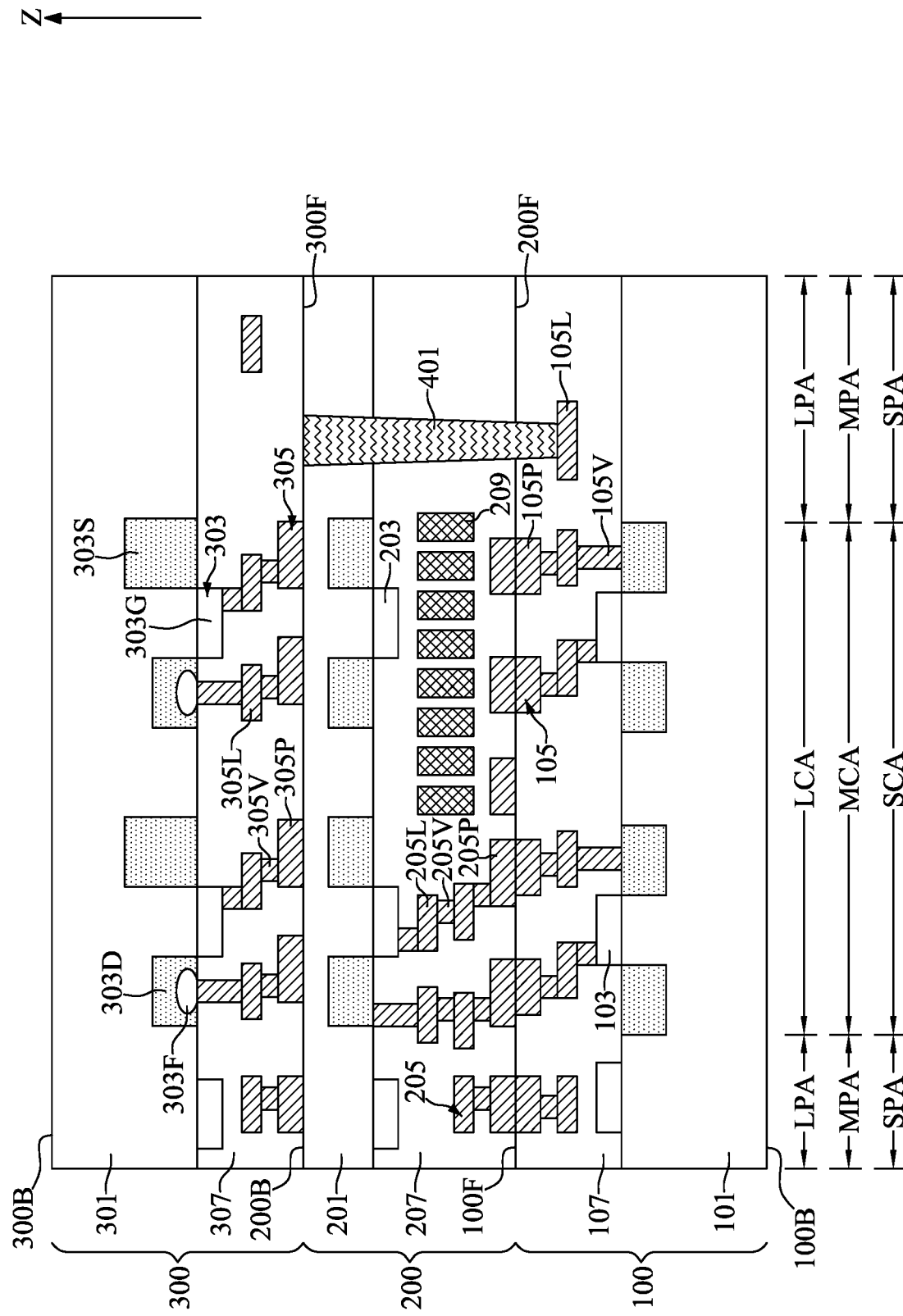
FIGS. 19 to 21 are schematic cross-sectional view diagrams illustrating part of a flow for fabricating the optical semiconductor device in accordance with another embodiment of the present disclosure.
Figure 20:
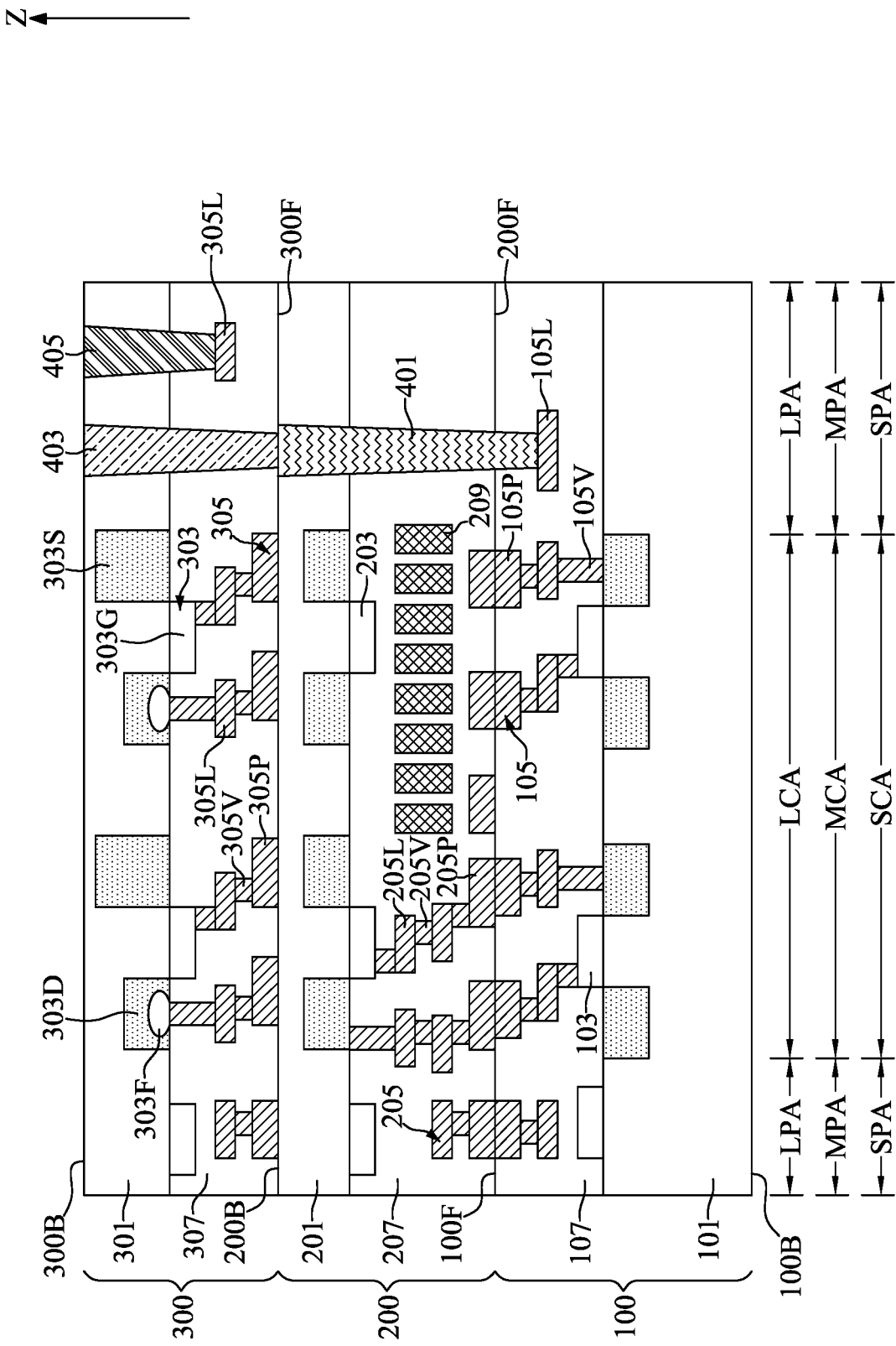
Figure 21:
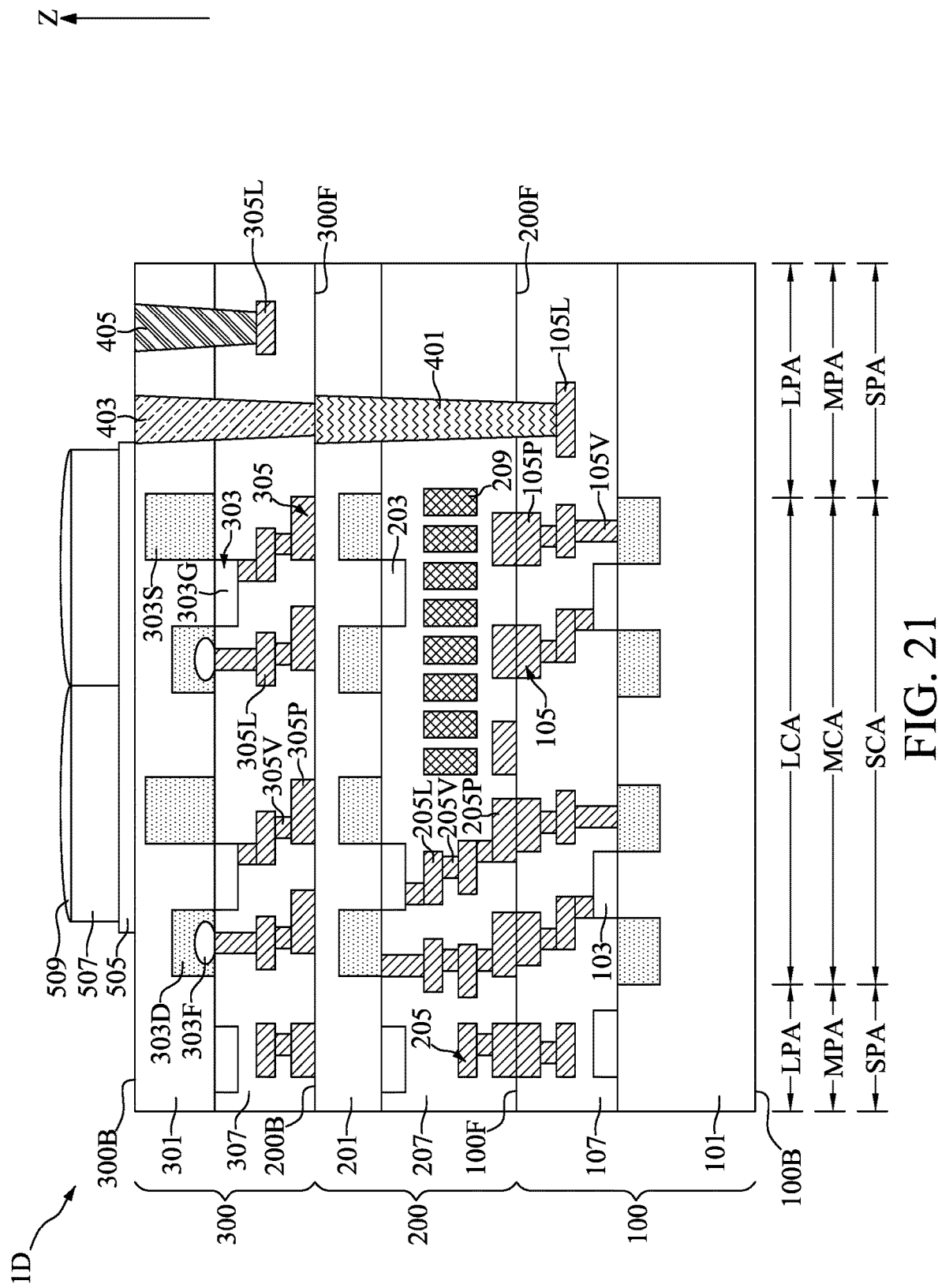

FIGS. 19 to 21 are schematic cross-sectional view diagrams illustrating part of a flow for fabricating the optical semiconductor device 1D in accordance with another embodiment of the present disclosure.

With reference to FIG. 19, an intermediate optical semiconductor device may be fabricated with a procedure similar to that illustrated in FIGS. 2 to 6, and descriptions thereof are not repeated herein. The sensor die 300 may be provided as illustrated in FIG. 11, and descriptions thereof are not repeated herein. The sensor die 300 may be flipped and bonded onto the memory die 200 directly.

With reference to FIG. 20, the third substrate 301 may be thinned with a process similar to that illustrated in FIG. 13, and descriptions thereof are not repeated herein. The first intra-die via 403 may be formed along the third substrate 301 and the third dielectric layer 307, and directly on the first inter-die via 401. In other words, the first inter-die via 401 and the first intra-die via 403 are topographically aligned and the first inter-die via 401 and the first intra-die via 403 are electrically connected. The second intra-die via 405 may be formed with a procedure similar to that illustrated in FIG. 14, and descriptions thereof are not repeated herein.

With reference to FIG. 21, the upper layer 505, the color filters 507, and the micro-lenses 509 may be formed with a procedure similar to that illustrated in FIG. 15, and descriptions thereof are not repeated herein.

FIGS. 22 to 29 are schematic cross-sectional view diagrams illustrating part of a flow for fabricating the optical semiconductor device 1E in accordance with another embodiment of the present disclosure.

Figure 22:
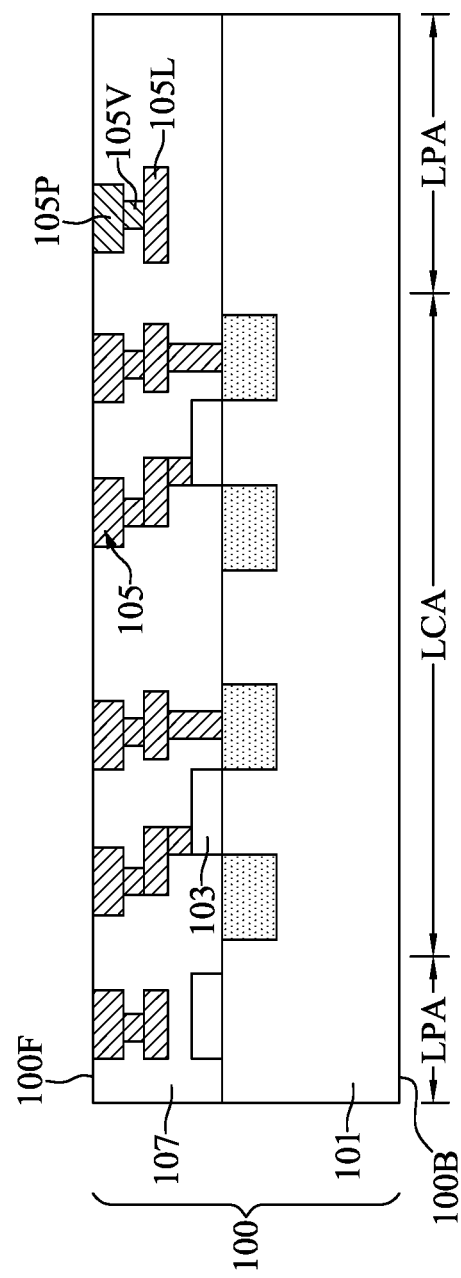
FIGS. 22 to 29 are schematic cross-sectional view diagrams illustrating part of a flow for fabricating the optical semiconductor device in accordance with another embodiment of the present disclosure.

With reference to FIG. 22, the logic die 100 may be provided as illustrated in FIG. 2. Above the logic peripheral circuit area LPA, one of the first conductive lines 105L, one of the first conductive vias 105V, and one of the first conductive pads 105P may be topographically aligned. In other word, the first conductive line 105L, the first conductive via 105V, and the first conductive via 105V are vertically arranged along the direction Z.

Figure 23:
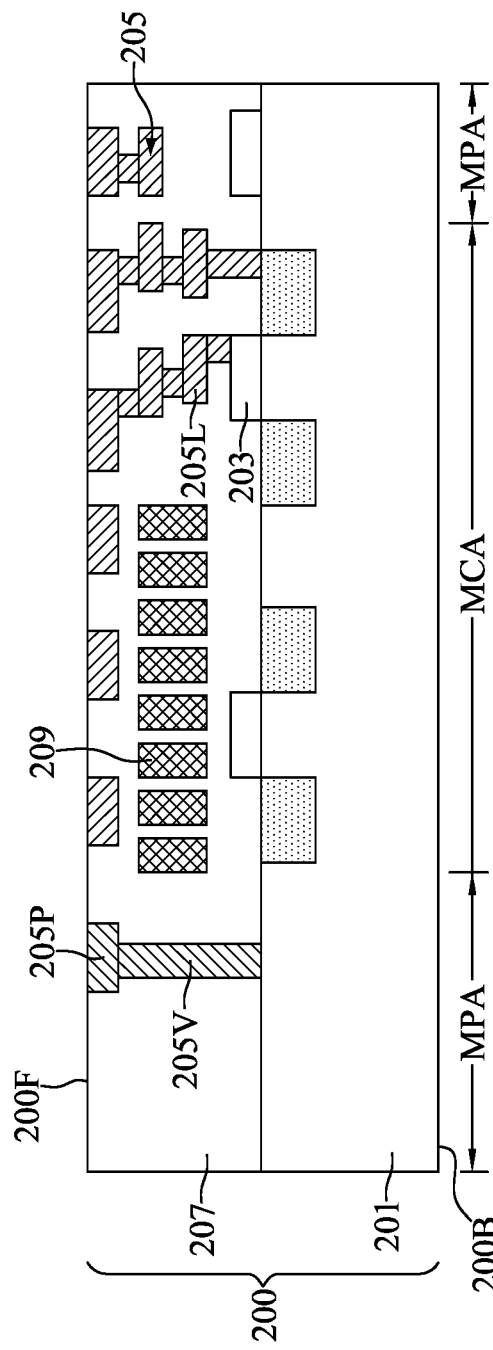

With reference to FIG. 23, the memory die 200 may be provided as illustrated in FIG. 3. Above the memory peripheral area MPA, one of the second conductive via 205V and one of the second conductive pad 205P may be topographically aligned. In other word, the second conductive via 205V and the second conductive pad 205P are vertically arranged along the direction Z.

Figure 24:
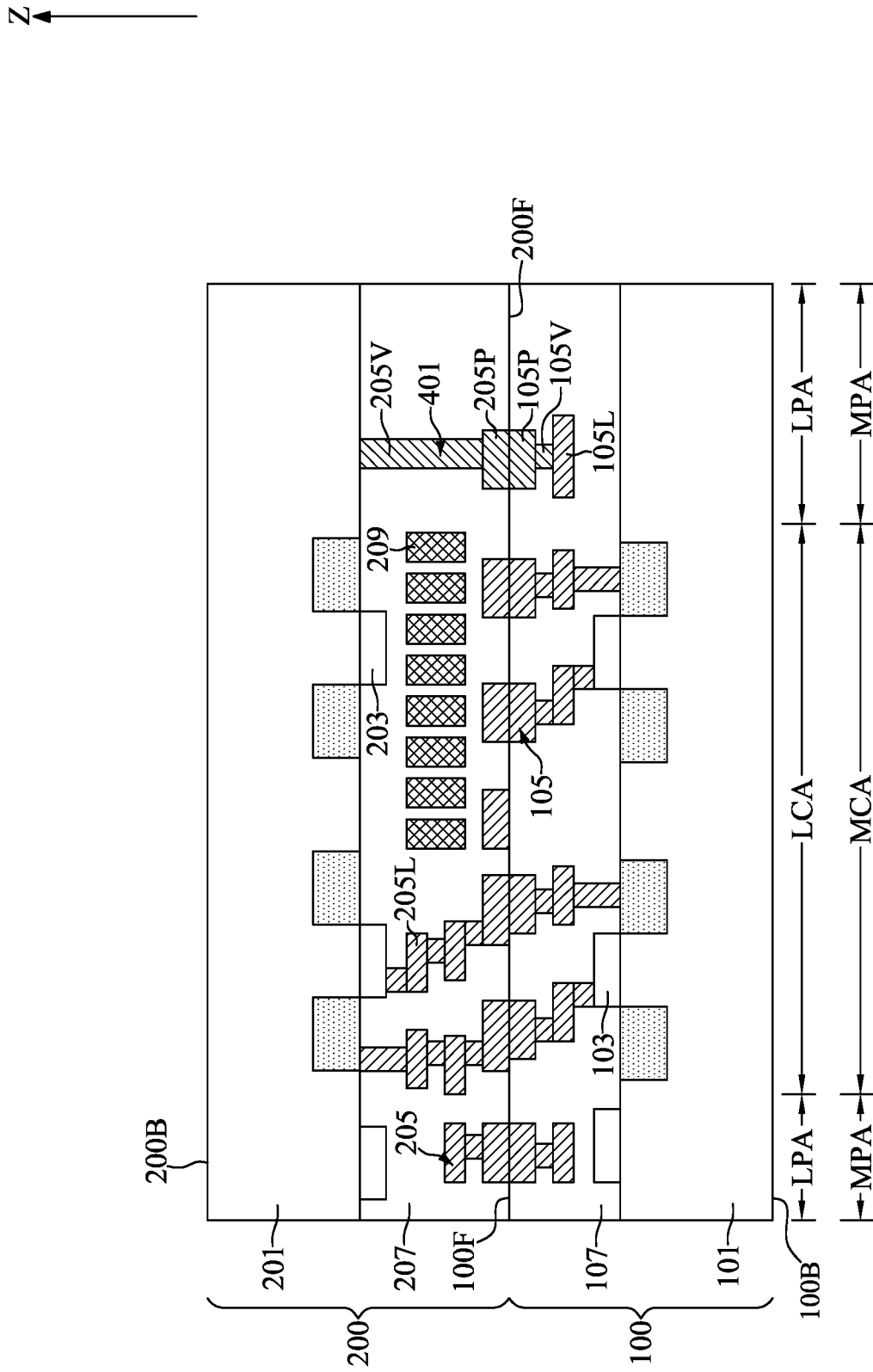

With reference to FIG. 24, the logic die 100 and the memory die 200 may be bonded in a face-to-face manner with a procedure similar to that illustrated in FIG. 4. After bonding, the second conductive via 205V and the second conductive pad 205P located at the memory peripheral area MPA may topographically aligned with the first conductive line 105L, the first conductive via 105V, and the first conductive pad 105P located at the logic peripheral circuit area LPA. That is, at the logic peripheral circuit area LPA and at the memory peripheral area MPA, the first conductive line 105L, the first conductive via 105V, the first conductive pad 105P, the second conductive pad 205P, and the second conductive via 205V are vertically arranged along the direction Z and together configure the first inter-die via 401 which can communicate the memory die 200 and the logic die 100.

Figure 25:
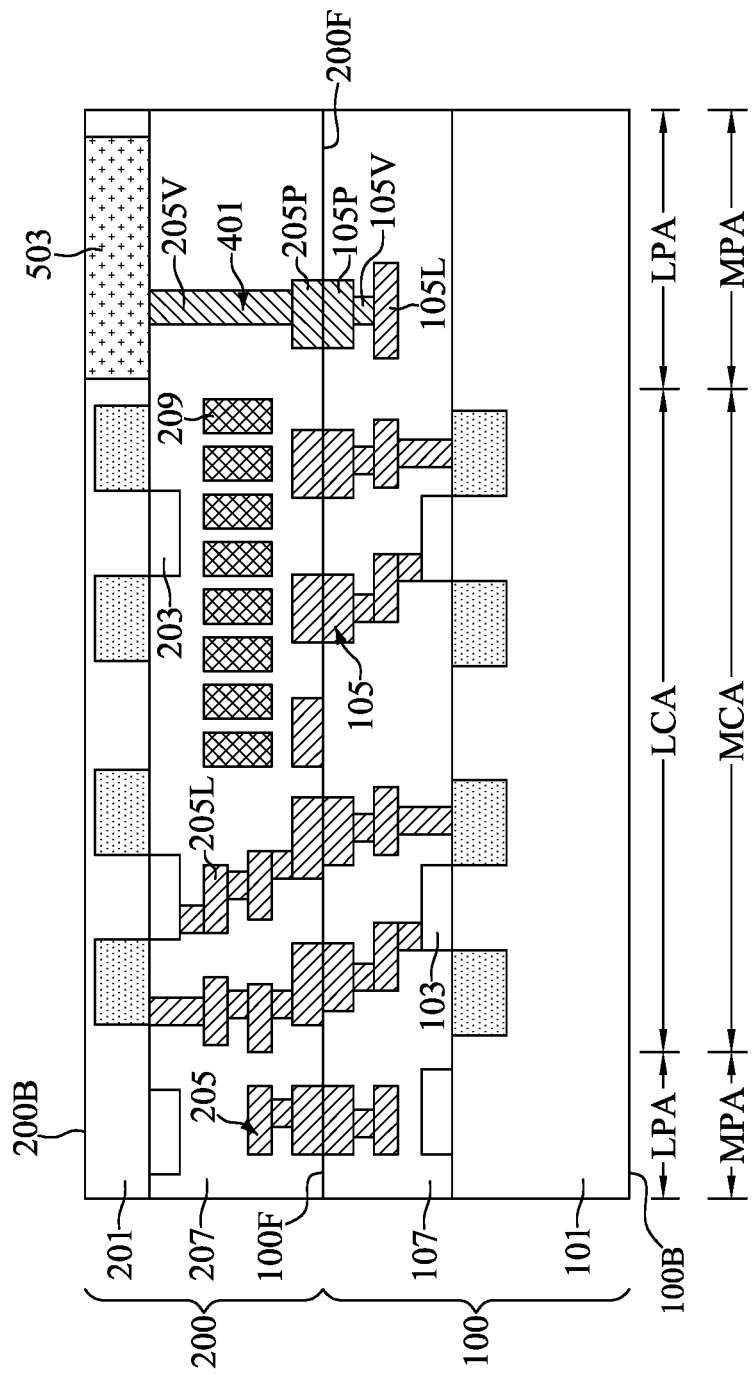

With reference to FIG. 25, the second substrate 201 of the memory die 200 may be thinned with a procedure similar to that illustrated in FIG. 5, and descriptions thereof are not repeated herein. The landing pad 503 may be formed in the second substrate 201 and on the first inter-die via 401.

Figure 26:
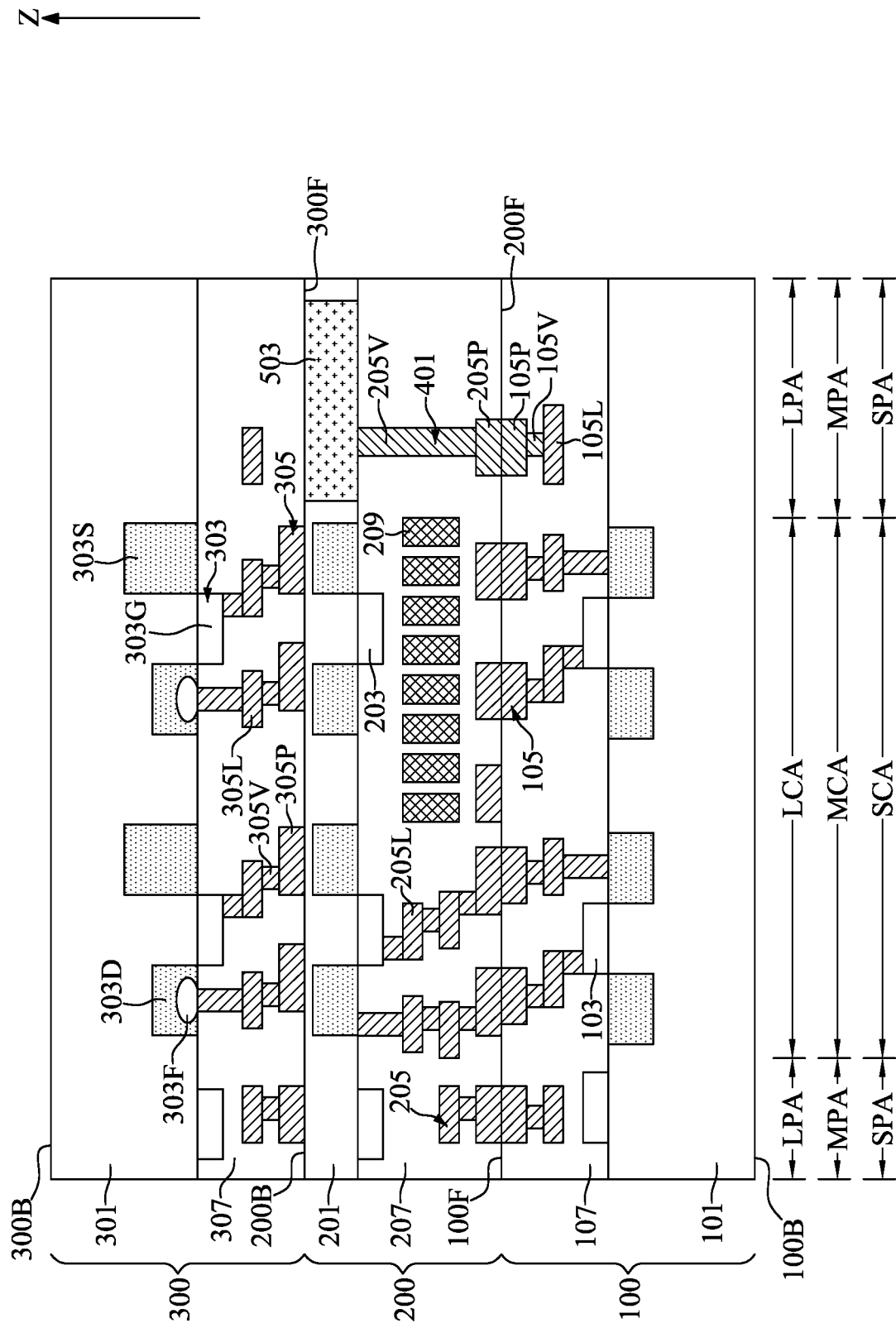

With reference to FIG. 26, the sensor die 300 may be provided as illustrated in FIG. 11, and descriptions thereof are not repeated herein. The sensor die 300 may be flipped and bonded on the memory die 200 directly.

Figure 27:
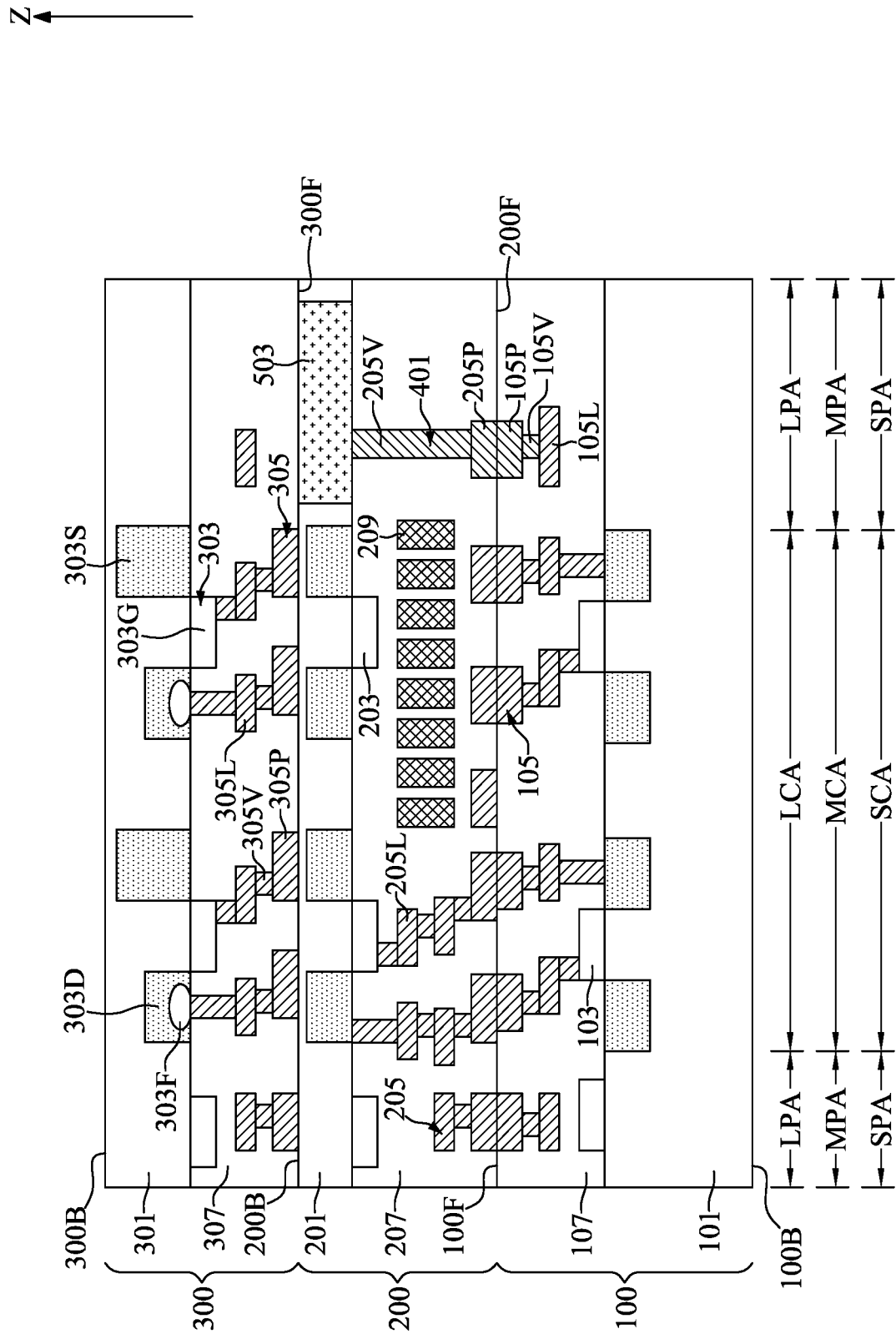
Figure 28:
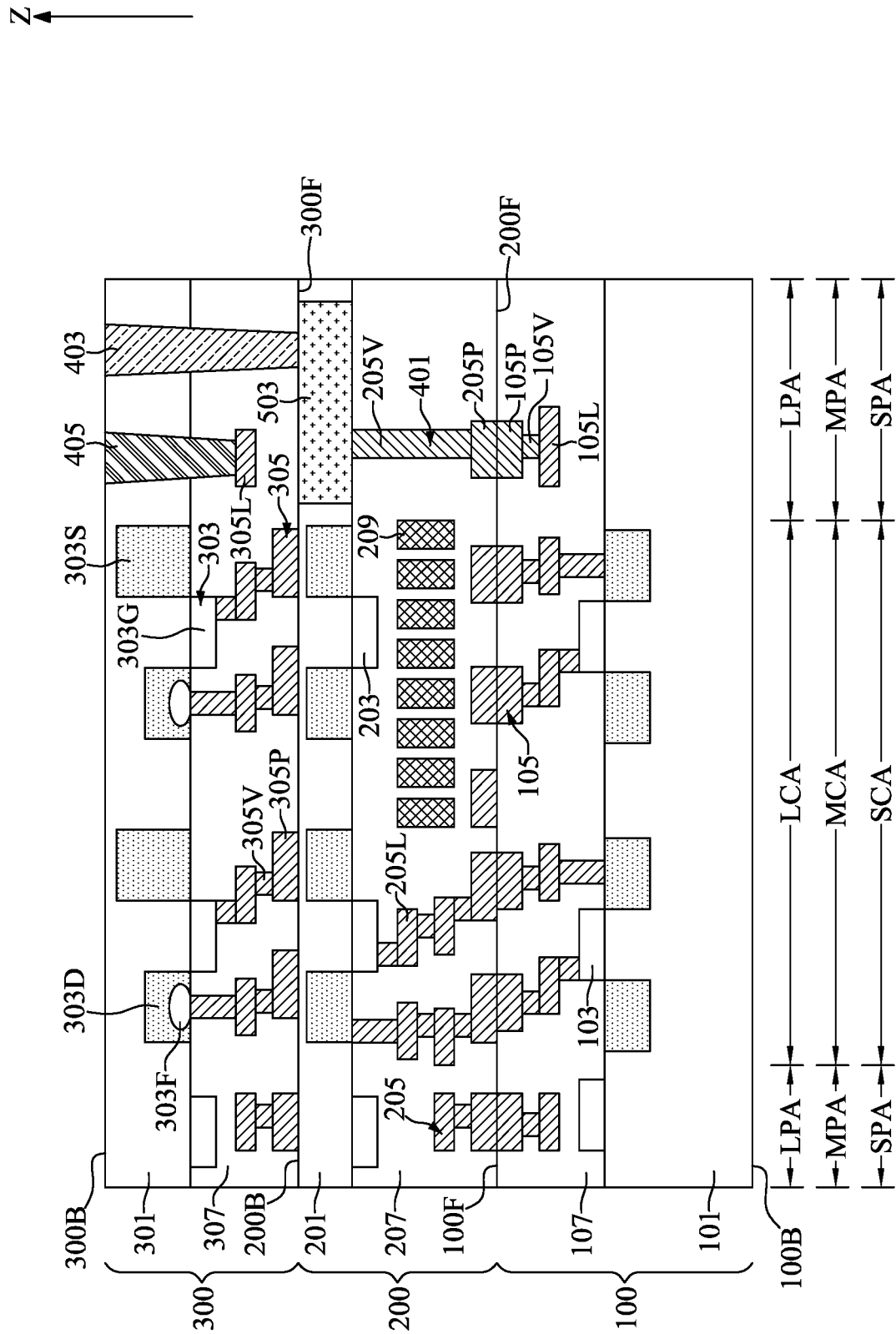
Figure 29:
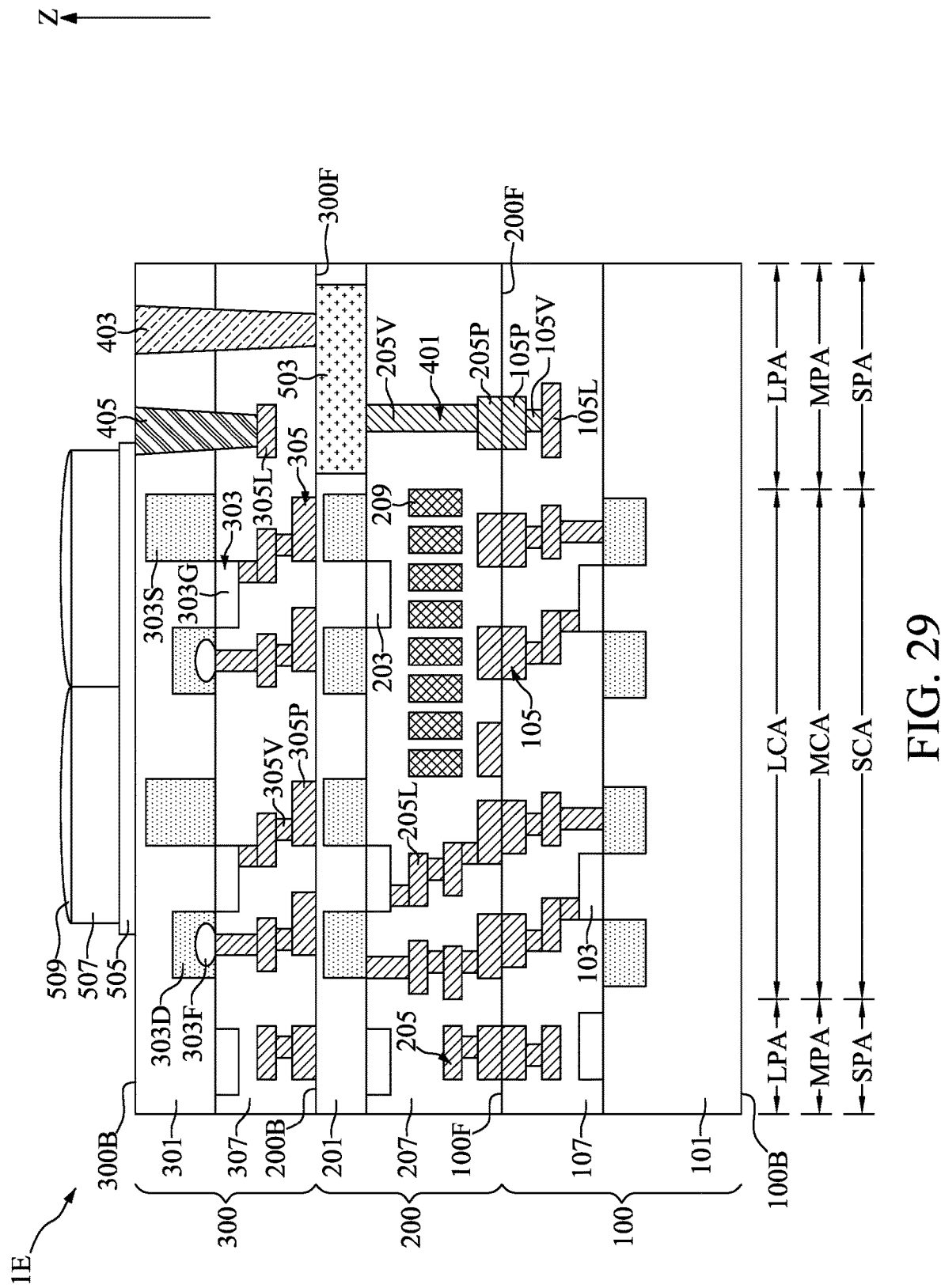

With reference to FIGS. 27 to 29, the thinning process of the third substrate 301, the fabrication of the first intra-die via 403, the second intra-die via 405, the upper layer 505, the color filters 507, and the micro-lenses 509 may be similar to a procedure that illustrates in FIGS. 13 to 15, and descriptions thereof are not repeated herein.

Figure 30:
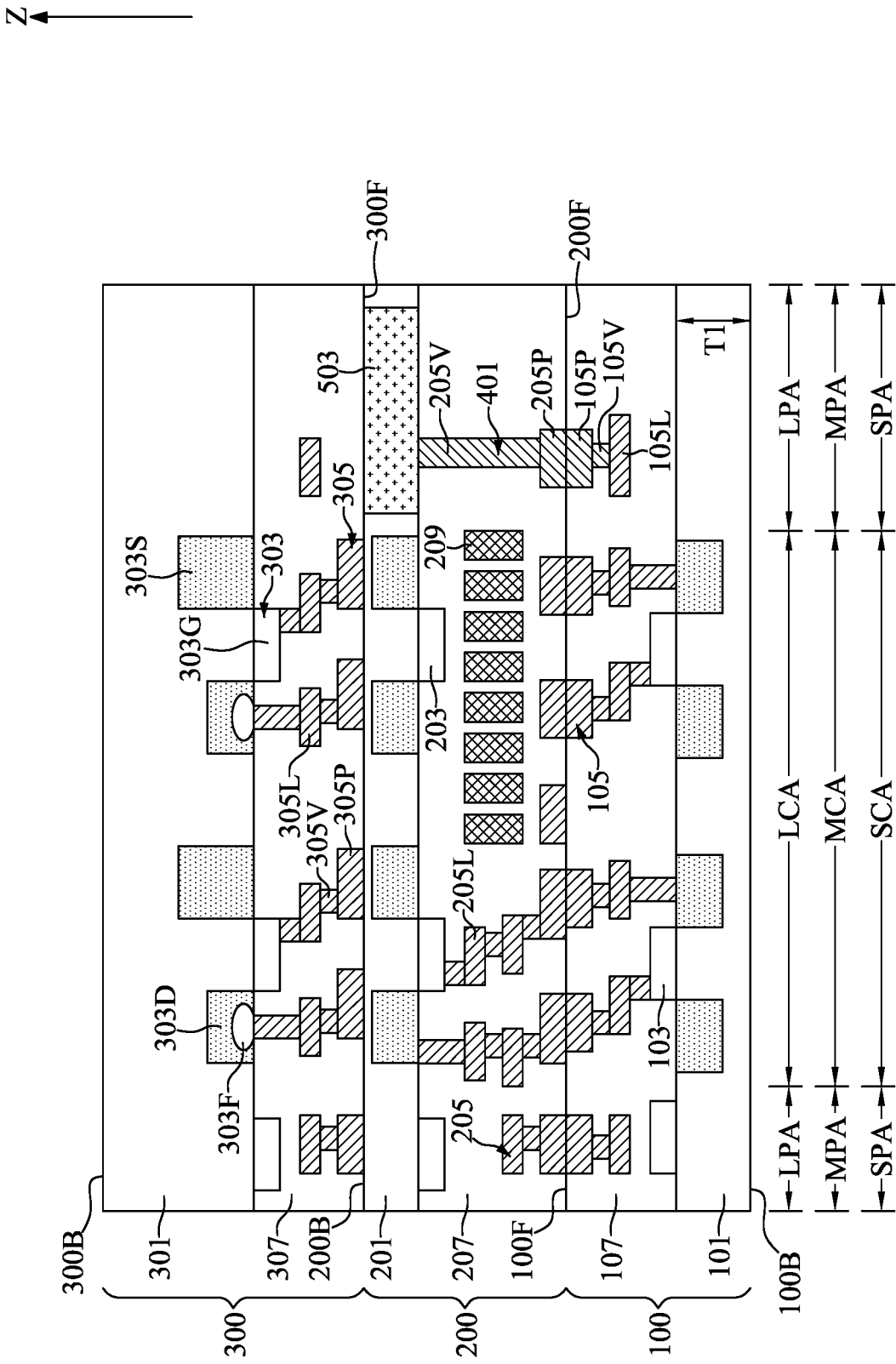
FIGS. 30 and 31 are schematic cross-sectional view diagrams illustrating part of a flow for fabricating the optical semiconductor device in accordance with another embodiment of the present disclosure.
Figure 31:
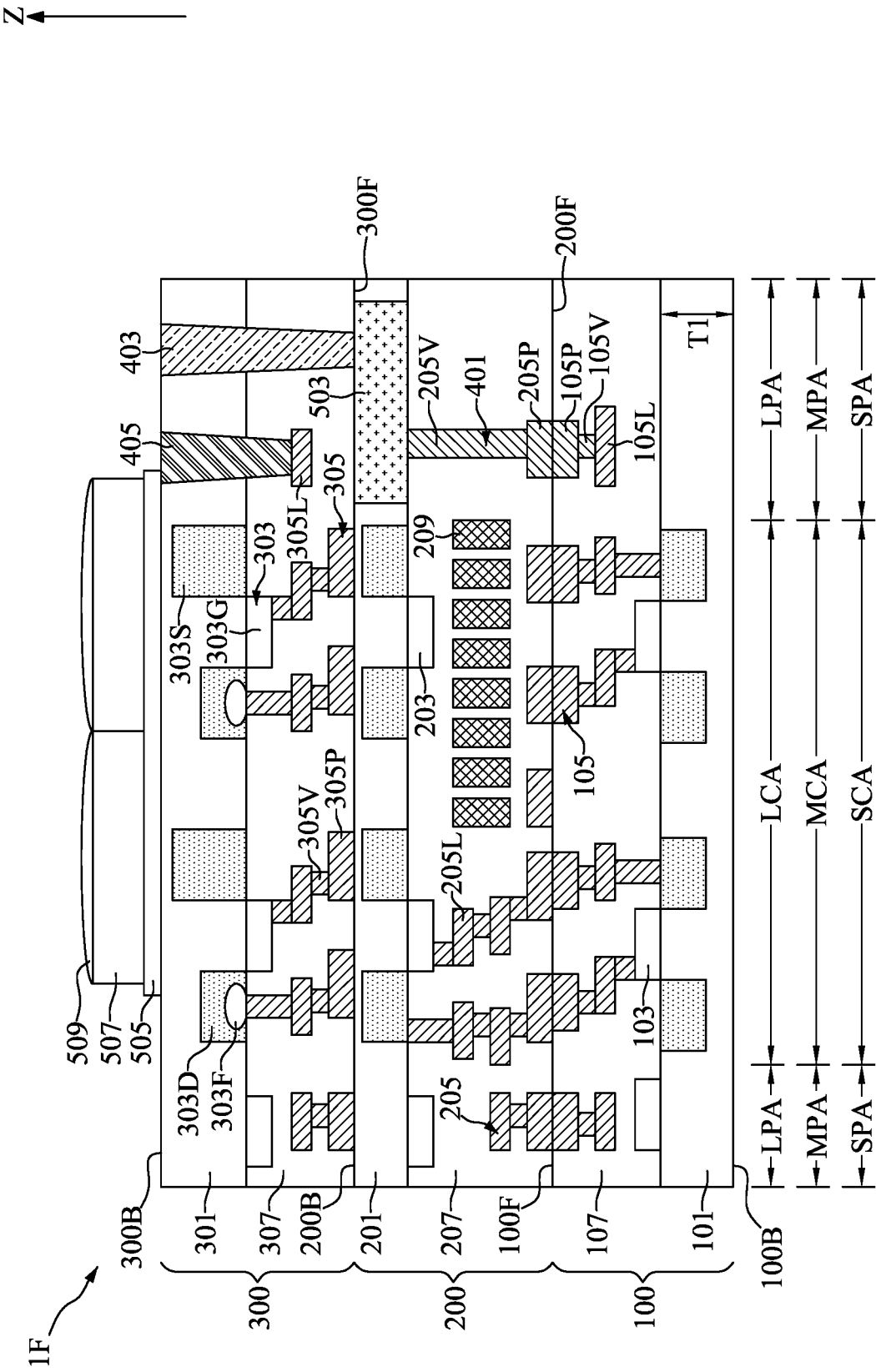

FIGS. 30 and 31 are schematic cross-sectional view diagrams illustrating part of a flow for fabricating the optical semiconductor device 1F in accordance with another embodiment of the present disclosure.

With reference to FIG. 30, an intermediate optical semiconductor device may be fabricated with a procedure similar to that illustrates in FIGS. 22 to 26, and descriptions thereof are not repeated herein. The first substrate 101 of the logic die 100 may be thinned through a thinning process using wafer grinding, mechanical abrasion, polishing, or the like, or using chemical removal, such as a wet etch. In some embodiments, the thinning process of the first substrate 101 may not be performed with a carrier. The memory die 200 and the sensor die 300 may serve as a temporary carrier to prevent the logic die 100 from breaking even through the logic die 100 has a small thickness during and after the thinning process of the first substrate 101. After the thinning process, the thickness T1 of the first substrate 101 may be between about 5 μm and 100 μm or less than about 10 μm.

With reference to FIG. 31, the thinning process of the third substrate 301, the fabrication of the first intra-die via 403, the second intra-die via 405, the upper layer 505, the color filters 507, and the micro-lenses 509 may be similar to a procedure illustrated in FIGS. 13 to 15, and descriptions thereof are not repeated herein. Because a carrier is not necessary during the thinning process of the first substrate 101, the cost and process complexity of fabricating the optical semiconductor device 1F may be reduced.

One aspect of the present disclosure provides an optical semiconductor device including a logic die including a core circuit area and a logic peripheral circuit area; a memory die positioned on the logic die and including a memory cell area and a memory peripheral area, and a first inter-die via positioned in the memory peripheral area and electrically connected to the logic peripheral circuit area; and a sensor die positioned on the memory die and including a sensor pixel area and a sensor peripheral area, a first intra-die via positioned in the sensor peripheral area and electrically coupled to the logic peripheral circuit area through the first inter-die via, and a second intra-die via positioned in the sensor peripheral area. A height of the first intra-die via is greater than a height of the second intra-die via.

Another aspect of the present disclosure provides an optical semiconductor device including a logic die including a front surface; a memory die including a front surface positioned on the front surface of the logic die, and a back surface opposite to the front surface of the memory die; and a sensor die including a front surface positioned on the back surface of the memory die, a back surface opposite to the front surface of the sensor die, a sensor unit located at the back surface of the sensor die, a color filter positioned on the back surface of the sensor die, and a micro-lens positioned on the color filter.

Another aspect of the present disclosure provides an optical semiconductor device including a logic die including a core circuit area and a logic peripheral circuit area; a memory die positioned on the logic die and including a memory cell area and a memory peripheral area; a first inter-die via positioned in the memory peripheral area; a landing pad positioned on the first inter-die via; and a sensor die positioned on the memory die and including a sensor pixel area and a sensor peripheral area, a first intra-die via positioned in the sensor peripheral area. The first inter-die via and the first intra-die via are electrically coupled through the landing pad in a cascade manner.

Due to the design of the optical semiconductor device of the present disclosure, by employing the first inter-die via 401, the first intra-die via 403, and the second intra-die via 405, the signal produced in the sensor die 300 may be transferred to the functional circuits of the logic die 100 to perform various processing which usually needs complicate circuits. That is, the sensor die 300 can only reserve the essential elements for optical sensing function so that the complexity of fabrication of the sensor die 300 may be simplified. As a result, the yield of the optical semiconductor device 1A may be improved. In addition, the first inter-die via 401, the first intra-die via 403, and the second intra-die via 405 may also shorten the signal path between the function circuits of different dies so that the energy consumption for signal transferring may be reduced. Furthermore, by further integrating the memory die 200, the intermediate processing or the post processing signal may be easily stored.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a logic die comprising:
   a core circuit area and a logic peripheral circuit area;
a memory die positioned on the logic die and comprising:
   a memory cell area and a memory peripheral area;
a first inter-die via positioned in the memory peripheral area, wherein the first inter-die via has a back end extended to a back surface of the memory die and a front end extended through a front surface of the memory die;
a landing pad positioned on the first inter-die via; and
a sensor die positioned on the memory die and comprising:
   a sensor pixel area and a sensor peripheral area;
   a first intra-die via positioned in the sensor peripheral area, wherein the first intra-die via has a back end extended to a back surface of the sensor die and a front end extended to a front surface of the sensor die;
wherein the landing pad has a front surface in contact with the back surface of the memory die and a back surface in contact with the front surface of the sensor die;
wherein the first inter-die via and the first intra-die via are electrically coupled through the landing pad in a cascade manner.

2. The semiconductor device of claim 1, wherein the first inter-die via and the first intra-die via are not topographically aligned, wherein the back end of the first inter-die via is in contact with the front surface of the landing pad while the front end of the first intra-die via is in contact with the back surface of the landing pad.

3. The semiconductor device of claim 2, wherein the first inter-die via is electrically connected to the logic peripheral circuit area and the memory peripheral area.

4. The semiconductor device of claim 3, wherein the sensor die comprises:
a dielectric layer of the sensor die;
a substrate positioned on the dielectric layer of the sensor die; and
a sensor unit positioned in the substrate of the sensor die;
wherein the back end of the first intra-die via is extended to a back surface of the substrate while the front end of the first intra-die via is extended to a front surface of the dielectric layer, such that the first intra-die via is positioned penetrating along the substrate of the sensor die and the dielectric layer of the sensor die, and positioned on the landing pad.

5. The semiconductor device of claim 4, further comprising a transfer gate in the dielectric layer of the sensor die.

6. The semiconductor device of claim 5, further comprising a floating diffusion unit positioned in the substrate of the sensor die and positioned in a drain of the transfer gate.

7. The semiconductor device of claim 6, further comprising a color filter positioned on the substrate of the sensor die and above the sensor unit.

8. The semiconductor device of claim 7, further comprising a micro-lens positioned on the color filter.

9. The semiconductor device of claim 8, further comprising an upper layer positioned between the color filter and the substrate of the sensor die;
wherein the upper layer comprises a bottom anti-reflective coating.

10. The semiconductor device of claim 9, further comprising an intervening insulating layer positioned between the memory die and the sensor die at a position that a front surface of the intervening insulating layer is in contact with the back surface of the memory die while a back surface of the intervening insulating layer is in contact with the front surface of the sensor die;
wherein the landing pad is positioned in the intervening insulating layer, wherein a thickness of the landing pad is equal to a thickness of the intervening insulating layer.

11. The semiconductor device of claim 10, wherein the sensor unit includes a photodiode, wherein each of the first inter-die via and the first intra-die via has a tapered shape that a width thereof is gradually reduced from the back end to the front end.

* * * * *